US008598564B2

(12) United States Patent
Sakotsubo

(10) Patent No.: US 8,598,564 B2
(45) Date of Patent: Dec. 3, 2013

(54) NONVOLATILE SEMICONDUCTOR MEMORY DEVICE AND MANUFACTURING METHOD THEREOF

(75) Inventor: Yukihiro Sakotsubo, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 13/592,574

(22) Filed: Aug. 23, 2012

(65) Prior Publication Data
US 2013/0062588 A1    Mar. 14, 2013

(30) Foreign Application Priority Data
Sep. 9, 2011   (JP) .................... 2011-197398

(51) Int. Cl.
*H01L 47/00*   (2006.01)
(52) U.S. Cl.
USPC ............. 257/4; 257/9; 257/74; 257/E21.003; 438/104; 438/382; 365/148; 365/163
(58) Field of Classification Search
USPC ............... 257/1–4, 9, 74, E45.003, E21.003, 257/E47.005; 438/104, 382; 365/148, 163
See application file for complete search history.

(56) References Cited

FOREIGN PATENT DOCUMENTS

JP     2007-149170 A   6/2007

OTHER PUBLICATIONS

W. W. Zhuang et al., "Novel Colossal Magnetoresistive Thin Film Nonvolatile Resistance Random Access Memory (RRAM)", Electron Devices Meeting, 2002. IEDM '02. Digest. International, pp. 193-196 (2002).
Shima et al. "Resistance switching in the metal deficient-type oxides: NiO and CoO", Appl. Phys. Lett. 91, 012901 (2007).
G. S. Park et al., "Observation of electric-field induced Ni filament channels in polycrystalline NiOx film", Appl. Phys. Lett. 91, 222103 (2007).
C. Yoshida et al., "High speed resistive switching in Pt/TiO2/TiN film for nonvolatile memory application", Appl. Phys. Lett. 91, 223510 (2007).

*Primary Examiner* — Mark A Laurenzi
(74) *Attorney, Agent, or Firm* — Miles & Stockbridge P.C.

(57) ABSTRACT

A nonvolatile semiconductor memory device has a first wire, a second wire, and a memory cell electrically coupled to the first wire at one end and to the second wire at the other end. The memory cell has a resistance change layer to store information by changing a resistance value and a first electrode and a second electrode coupled to both ends of the resistance change layer and not containing a precious metal. The first electrode includes an outside electrode and an interface electrode formed between the outside electrode and the resistance change layer. The thickness of the interface electrode is less than the thickness of the outside electrode. The resistivity of the interface electrode is higher than the resistivity of the outside electrode. The resistance value of the first electrode is lower than the resistance value of the resistance change layer in a low resistance state.

11 Claims, 27 Drawing Sheets

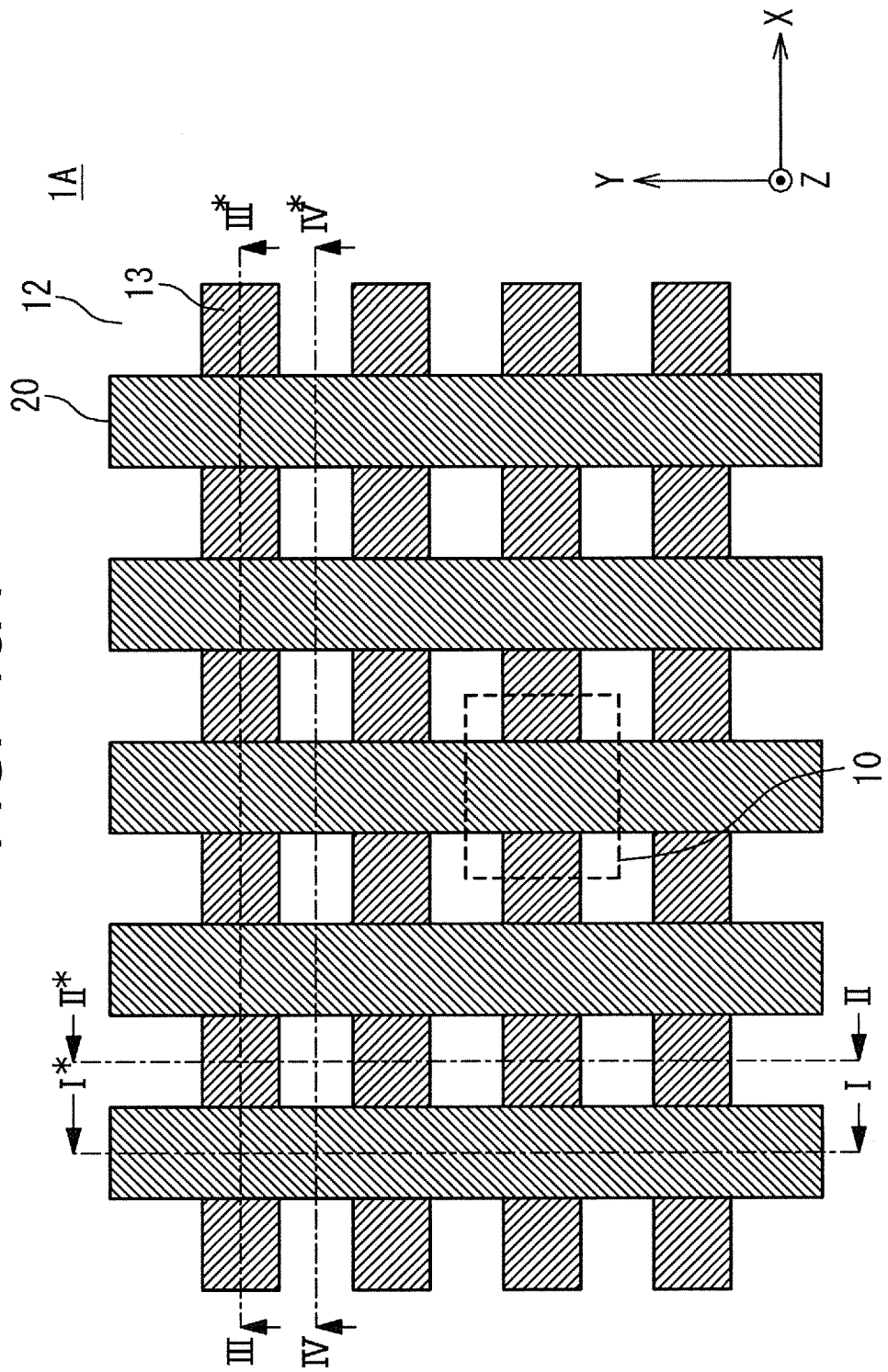

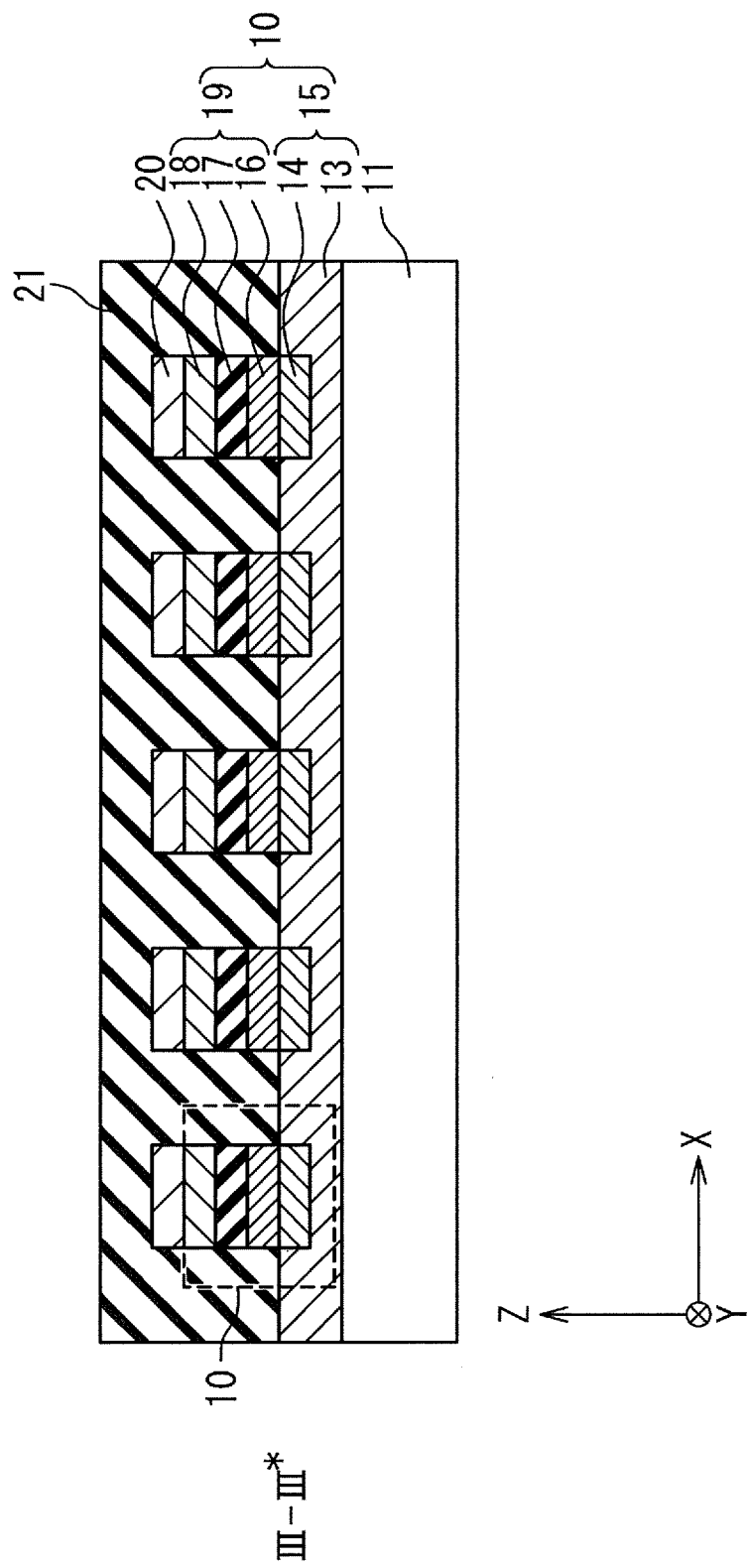

NONVOLATILE SEMICONDUCTOR MEMORY DEVICE AND MANUFACTURING METHOD THEREOF

CROSS-REFERENCE TO RELATED APPLICATIONS

The disclosure of Japanese Patent Application No. 2011-197398 filed on Sep. 9, 2011 including the specification, drawings and abstract is incorporated herein by reference in its entirety.

BACKGROUND

The present invention relates to a nonvolatile semiconductor memory device and a manufacturing method thereof, in particular to a resistance random access nonvolatile semiconductor memory device and a manufacturing method thereof.

In the field of a nonvolatile memory, a flash memory, an FeRAM (Ferroelectric Random Access Memory), an MRAM (Magnetic Random Access Memory), an OUM (Ovonic Unified Memory), a PRAM (Phase change Random Access Memory; Patent Literature 1) and the like have been actively studied.

Recently, a resistance random access nonvolatile memory (ReRAM), which is different from those nonvolatile memories, has been proposed (Non-Patent Literature 1). In this resistance random access nonvolatile memory, information is written by applying a voltage pulse and varying a resistance value of a resistance change part of the memory cell. A resistance random access nonvolatile memory makes it possible to read written information nondestructively. In addition, a resistance random access nonvolatile memory has a small element area and thus is capable of being multivalued. Consequently, a resistance random access nonvolatile memory is expected to be promising as it has higher potential than existent nonvolatile memories.

Resistance change mechanisms of resistance random access nonvolatile memories are classified into two major types; an electrochemical type and a filament type. Whereas an electrochemical type requires both positive and negative voltage's for varying a resistance, a filament type makes single polarity operation possible. (Non-Patent Literatures 1 and 2)

A resistance change element has a structure formed by interposing a resistance change layer between electrodes. That means a two-terminal element. As a material of the resistance change layer of a filament type resistance change element, a transition metal oxide such as WOx (tungsten oxide), NiOx (nickel oxide), TaOx (tantalum oxide), ZrOx (zirconium oxide), HfOx (hafnium oxide), or the like is mostly used. In many cases, the initial state is in an insulated state. As a material of the electrodes, a simple substance of a metal, particularly a precious metal, such as Pt (platinum), Ru (ruthenium), W (tungsten), Al (aluminum), Cu (copper), or the like is mostly used.

FIG. 1 is a schematic view showing an example in an operation method of a typical filament type resistance change element. The resistance change element: has a structure formed by stacking an upper electrode 252, resistance change layer 241 and a lower electrode 251; and is coupled to a transistor 250 in series.

Initialization is carried out by dielectric breakdown between electrodes. That is, as shown in (a), a voltage $V_{T.E.}$ applied to an upper electrode 252, a voltage $V_{B.E.}$ applied to a lower electrode 251, and a voltage $V_G$ applied to the gate of a transistor 250 are set at 2.5 V, 0 V, and 2 V, respectively. Dielectric breakdown voltage is thus applied between the upper electrode 252 and the lower electrode 251. As a result, as shown in (b), in a part of a resistance change layer 241, a low-resistance conductive path called a filament 241a is formed like a bridge (also called "forming") between the upper electrode 252 and the lower electrode 251. The state is called a low resistance state (LRS). On this occasion, the resistance of the filament 241a is controlled so as not to be excessively low by controlling electric current flowing in the filament 241a after dielectric breakdown through an external circuit (not shown in the figure). For example, the flowing electric current is adjusted so as to have a resistance of 1 kW.

Resistance increase is carried out by cutting a part of a filament. That is, as shown in (b), the voltage $V_{T.E.}$ applied to an upper electrode 252, the voltage $V_{B.E.}$ applied to a lower electrode 251, and the voltage $V_G$ applied to the gate of a transistor 250 are set at 1.0 V, 0 V, and 5 V, respectively. As a result, as shown in (c), a part of a filament 241a is cut (also called "reset"). This state is called a high resistance state (HRS). The cut of the filament 241a is caused by giving a power of not less than a threshold value to the filament 241a. On this Occasion, a voltage exceeding the threshold value has to be applied to both the ends of the filament 241a ($P=V^2/R$, $V>(RP)^{0.5}$). It is known that the part where the filament 241a is cut can be explained by a tunnel barrier model.

Resistance decrease is carried out by applying a voltage higher than a resistance increase voltage to a filament and thus coupling the cut filament again. That is, as shown in (c), the voltage $V_{T.E.}$ applied to an upper electrode 252, the voltage $V_{B.E.}$ applied to a lower electrode 251, and the voltage $V_G$ applied to the gate of a transistor 250 are set at 2.5 V, 0 V, and 2 V, respectively. As a result, as shown in (b), the cut filament 241a is coupled again (also called "set"). The state is a low resistance state (LRS). The filament 241a is coupled again by the dielectric breakdown of a tunnel barrier.

PREVIOUS TECHNICAL LITERATURE

Patent Literature

[Patent Literature 1]
Japanese Unexamined Patent Publication No. 2007-149170

Non-Patent Literature

[Non-Patent Literature 1]
W. W. Zhuang et al., "Novel Colossal Magnetoresistive Thin Film Nonvolatile Resistance Random Access Memory (RRAM)", Electron Devices Meeting, 2002. IEDM '02. Digest. International, pp. 193-196 (2002).
[Non-Patent Literature 2]
Shima et al. "Resistance switching in the metal deficient-type oxides: NiO and CoO", Appl. Phys. Lett. 91, 012901 (2007).
[Non-Patent Literature 3]
G. S. Park et al., "Observation of electric-field induced Ni filament channels in polycrystalline NiOx film", Appl. Phys. Lett. 91, 222103 (2007).
[Non-Patent Literature 4]
C. Yoshida et al., "High speed resistive switching in Pt/TiO2/TiN film for nonvolatile memory application", Appl. Phys. Lett. 91, 223510 (2007).

SUMMARY

As stated above, a precious metal is mostly used as a material of an electrode in a resistance change element. One of the reasons is that, when a precious metal is used as an electrode material, the electrode is hardly oxidized and thus a good resistance change characteristic is obtained. If the electrode material is a material easily oxidized, the reliability of a memory cell is adversely affected like a retention characteristic deteriorates.

When a precious metal is used however, there are the following problems. Firstly, a precious metal is hardly processed through a dry-process. In addition, a precious metal itself is expensive. Further, a manufacturing process of a precious metal has no compatibility of a manufacturing line in relation to other manufacturing processes and hence the cost of introducing a manufacturing process increases. Moreover, from the view point of pollution, affinity with a CMOS line is poor.

In order to avoid the above problems, the inventors have studied a method of using an existing material with a high line compatibility such as titanium nitride as a material of an electrode in a resistance change element. Here, explanations are made on the basis of the case where, in a filament type resistance change element, ZrOx (zirconium oxide) is used for a resistance change layer and Ru (ruthenium) or TiNx (titanium nitride) is used for an electrode. In this case, an MIM (Metal/Insulator/Metal) part, namely electrode/resistance change element/electrode part, is Ru/ZrOx/Ru or TiNx/ZrOx/TiNX. The size of the element and the thickness of each film are identical between the case of using Ru and the case of using TiNx for the electrodes.

In the case of using Ru for an electrode, the resistance of a resistance change element increases when a voltage of about 0.5 V is applied to both the ends of an MIM part. Meanwhile, the resistance of the resistance change element decreases when a voltage of about 2.0 V is applied to both the ends of the MIM part. It has been found that there is a sufficient margin of about 1.5 V between the resistance increase voltage and the resistance decrease voltage even in consideration of the variation of voltage. Consequently, when Ru is used for an electrode, a highly reliable resistance change characteristic can be obtained.

On the other hand, in the case of using TiNx for an electrode, the resistance of a resistance change element does not increase unless a voltage of about 0.8 V is applied to both the ends of an MIM part. Further, the resistance of the resistance change element decreases when a voltage of about 1.0 V is applied to both the ends of the MIM part. It has been found that there is scarce voltage difference between the resistance increase voltage and the resistance decrease voltage and a sufficient margin cannot be obtained in consideration of voltage variation. Consequently, when TiNx is used for an electrode, a good resistance change characteristic cannot be obtained. It is desirable to materialize a highly reliable resistance change element even when a precious metal is not used as an electrode. It is desirable to materialize a highly reliable resistance change element even when an electrically conductive material having a relatively high resistivity is used for an electrode. It is desirable to materialize a highly reliable resistance change element that uses a material having a high manufacturing line compatibility with other manufacturing processes as an electrode material.

Means for solving the problems are hereunder explained in reference to numbers and codes used in the embodiments of the invention. The numbers and the codes are added with parentheses in order to clarify the correspondence relationship between the descriptions in the scope of claims and embodiments of the invention. The numbers and the codes however should not be used for the interpretation of the technical scope in the invention described in the scope of claims.

A nonvolatile semiconductor memory device according to the present invention has a first wire (54), a second wire (55), and a memory cell (70) electrically coupled to the first wire (54) at an end and to the second wire (55) at the other end respectively. The memory cell (10) has a resistance change layer (41) to memorize information by the change of a resistance value and a first electrode (51) and a second electrode (52) being coupled to both the ends of the resistance change layer (41) and not containing precious metals. The first electrode (51) includes a first outside electrode (43) and a first interface electrode (42) formed between the first outside electrode (43) and the resistance change layer (41). The thickness of the first interface electrode (42) is thinner than the thickness of the first outside electrode (43). The resistivity of the first interface electrode (42) is higher than the resistivity of the first outside electrode (43). The resistance value (Rs) of the first electrode (51) is lower than the resistance value (Ron) of the resistance change layer (52) in a low resistance state.

The present invention makes it possible to materialize a highly reliable resistance change element even when an electrically conductive material having a relatively high resistivity is used for an electrode.

BRIEF DESCRIPTION OF THE DRAWINGS

FIG. 13A is a plan view showing the configuration example of the nonvolatile semiconductor memory device according to the fourth embodiment of the present invention.

FIG. 13D is a sectional view taken on line III-III* in FIG. 13A.

DETAILED DESCRIPTION

Embodiments of a nonvolatile semiconductor memory device and a manufacturing method thereof according to the present invention are hereunder explained in reference to figures attached.

First Embodiment

Figure 1:
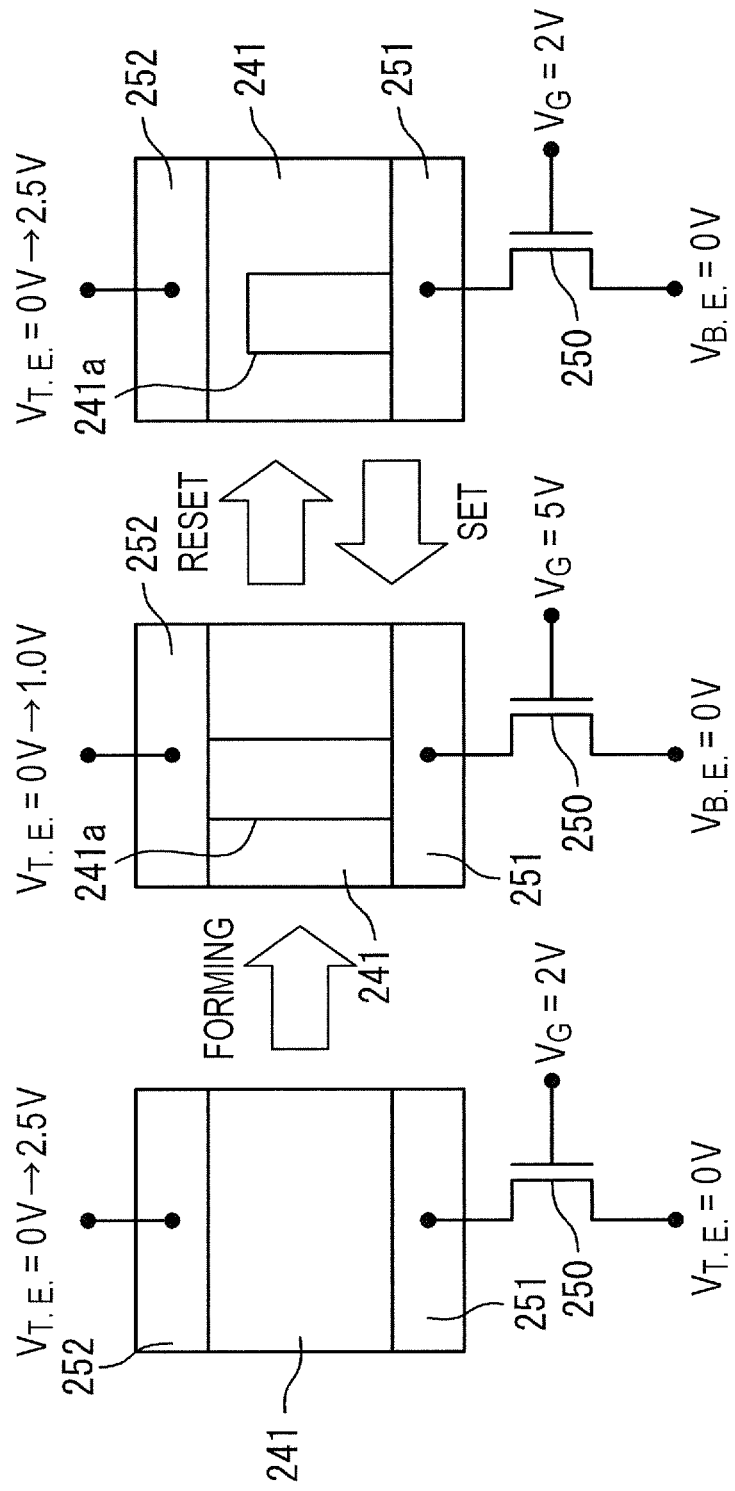
FIG. 1 is a schematic view showing an example in an operation method of a typical filament type resistance change element.
Figure 2:
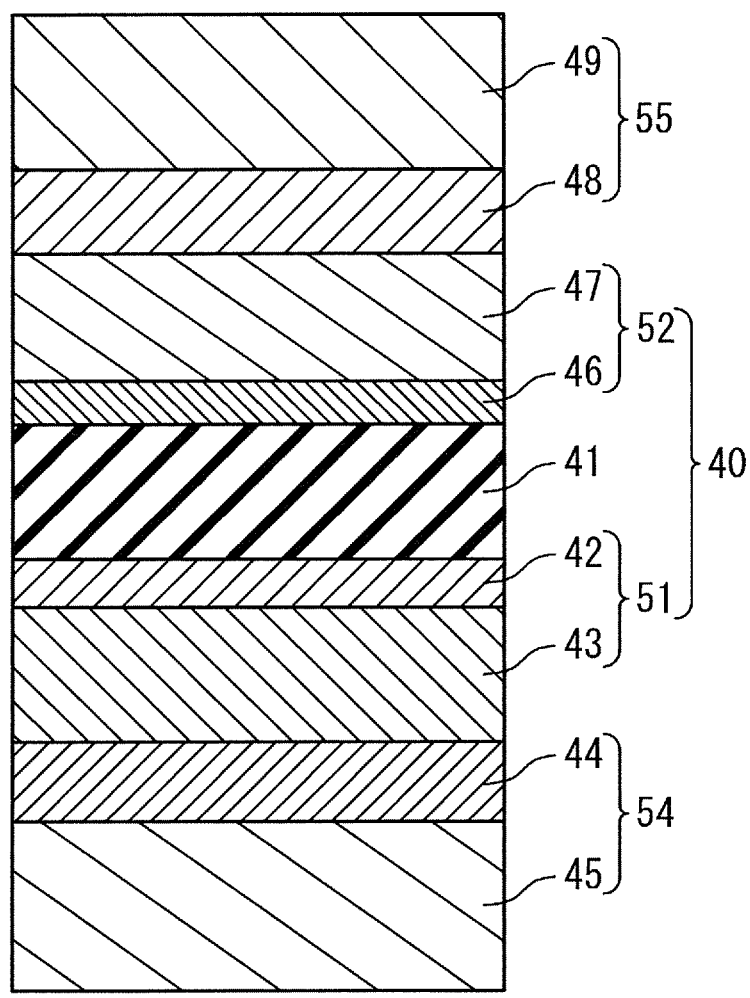
FIG. 2 is a sectional view schematically showing configuration example of a resistance change element in a nonvolatile semiconductor memory device according to a first embodiment of the present invention.

A nonvolatile semiconductor memory device according to the first embodiment of the present invention is explained. FIG. 2 is a sectional view schematically showing a configuration example of a resistance change element in a nonvolatile semiconductor memory device according to the first embodiment of the present invention. A resistance change element 40 is a filament type resistance change element and memorizes information by changing a resistance value. It is coupled to a first wire 54 on one side and to a second wire 55 on the other side respectively. Each of the first wire 54 and the second wire 55 is exemplified by a laminated body of a metal layer 45 or 49 comprising Cu (copper) or the like and a barrier layer 44 or 48 comprising TaNx (tantalum nitride) or the like.

The resistance change element 40 memorizes information by changing a resistance value. It has a resistance change layer 41 and a lower electrode 51 and an upper electrode 52 formed at both the ends.

The lower electrode 51 is an electrode on one side for supplying electric current and voltage to the resistance change, layer 41. It comprises an electrically conductive material not containing a precious metal. Details are explained later. The lower electrode 51 has a first interface electrode 42 and a first outside electrode 43. The first interface electrode 42 is formed so as to touch the resistance change layer 41 on one face and the first outside electrode 43 on the other fade. The first outside electrode 43 is formed so as to touch the first interface electrode 42 on one face and the barrier layer 44 of the first wire 54 on the other face.

The first interface electrode 42 comprises an electrically conductive material not containing a precious metal and being hardly oxidized in comparison with an element contained in the resistance change layer 41. For example, the absolute value of free energy for oxidization of the material of the first interface electrode 42 is smaller than the absolute value of free energy for oxidization of an element contained in the resistance change layer 41. In this way, the first interface electrode 42 is hardly oxidized, a good resistance change characteristic can be obtained, and the reliability of a memory cell improves. Examples of the material of the first interface electrode 42 are: Al (aluminum), Mg (magnesium), W (tungsten), Co (cobalt), Zn (zinc), Ni (nickel), K (potassium), Li (lithium), Fe (iron), Sn (tin), Cr (chromium), Pb (lead), Ti (titanium), and Ta (tantalum); alloys thereof; and oxides, nitrides, fluorides, carbides, and silicides thereof. It may be a laminated body of those materials. Among those materials, a transition metal nitride is particularly preferable from the viewpoints of the above characteristics and a material with a high manufacturing line compatibility. TiNx or TaNx is more desirable.

It is preferable that the first interface electrode 42 comprises about two or more atomic layers in order to surely cover the surface of the resistance change layer 41 since the first interface electrode 42 is required at least to have a function of preventing the interface between the lower electrode 51 and the resistance change layer 41 from oxidizing. On the other hand, it is preferable that the first interface electrode 42 comprises about 20 or less atomic layers in order to keep the resistance of the lower electrode 51 low since the above materials are likely to have high resistivities. Alternatively, it is preferable that the thickness of the first interface electrode 42 is not less than 1 nm to about 10 nm.

The first outside electrode 43 comprises an electrically conductive material not containing a precious metal and having a low resistivity in comparison with the material of the first interface electrode 42. In this way, it is possible to lower the whole resistance of the lower electrode 51 even when the first interface electrode 42 comprises a material having a relatively high resistivity. Examples of the material of the first outside electrode 43 are: Al (aluminum), Mg (magnesium), W (tungsten), Co (cobalt), Zn (zinc), Ni (nickel), K (potassium), Li (lithium), Fe (iron), Sn (tin), Cr (chromium), Pb (lead), Ti (titanium), and Ta (tantalum); alloys thereof; and oxides, nitrides, fluorides, carbides, and silicides thereof. It may be a laminated body of those materials.

The upper electrode 52 is an electrode on the other side for supplying electric current and voltage to the resistance change layer 41. It comprises an electrically conductive material not containing a precious metal. The upper electrode 52 is a single-layered electrode comprising any of the materials usable for the first interface electrode 42 and the first outside electrode 43. The upper electrode 52 does not necessarily have a double-layered structure because the resistance change element 40 only requires that at least one electrode has such characteristics as those of the lower electrode 51. It is preferable however that the upper electrode 52 has a second interface electrode 46 and a second outside electrode 47. The second interface electrode 46 and the second outside electrode 47 are identical to the first interface electrode 42 and the first outside electrode 43 respectively. On that occasion, the electrode can be a low resistance electrode being hardly oxidized and having a good resistance change characteristic.

The resistance change layer 41 memorizes information by changing a resistance value. As a material of the resistance change layer 41, a transition metal oxide is exemplified and preferably ZrOx (zirconium oxide), TaOx (tantalum oxide), or a laminated body thereof, those having a stoichiometric composition, is exemplified. The thickness of the resistance change layer 41 is preferably not less than 5 nm to about 20 nm.

Here, the resistance change element according to the present embodiment may have a structure formed by stacking neighboring layers at least in a partial region.

A resistance change element according to the present embodiment is hereunder explained in detail. An initialization treatment is important in a resistance change element 40 according to the present embodiment. The initialization treatment; is a treatment of applying an initialization voltage between a lower electrode 51 and an upper electrode 52 interposing a resistance change layer 41 and lowering the resistance value of the resistance change layer 41 to a value lower than the resistance value before voltage is applied; and is called "forming" (Non-Patent Literatures 3 and 4). After the treatment is applied, by applying a prescribed voltage between the lower electrode 51 and the upper electrode 52, it is possible to change resistance from a low resistance state to a high resistance state or from a high resistance state to a low resistance state and maintain either resistance state.

Figure 3:
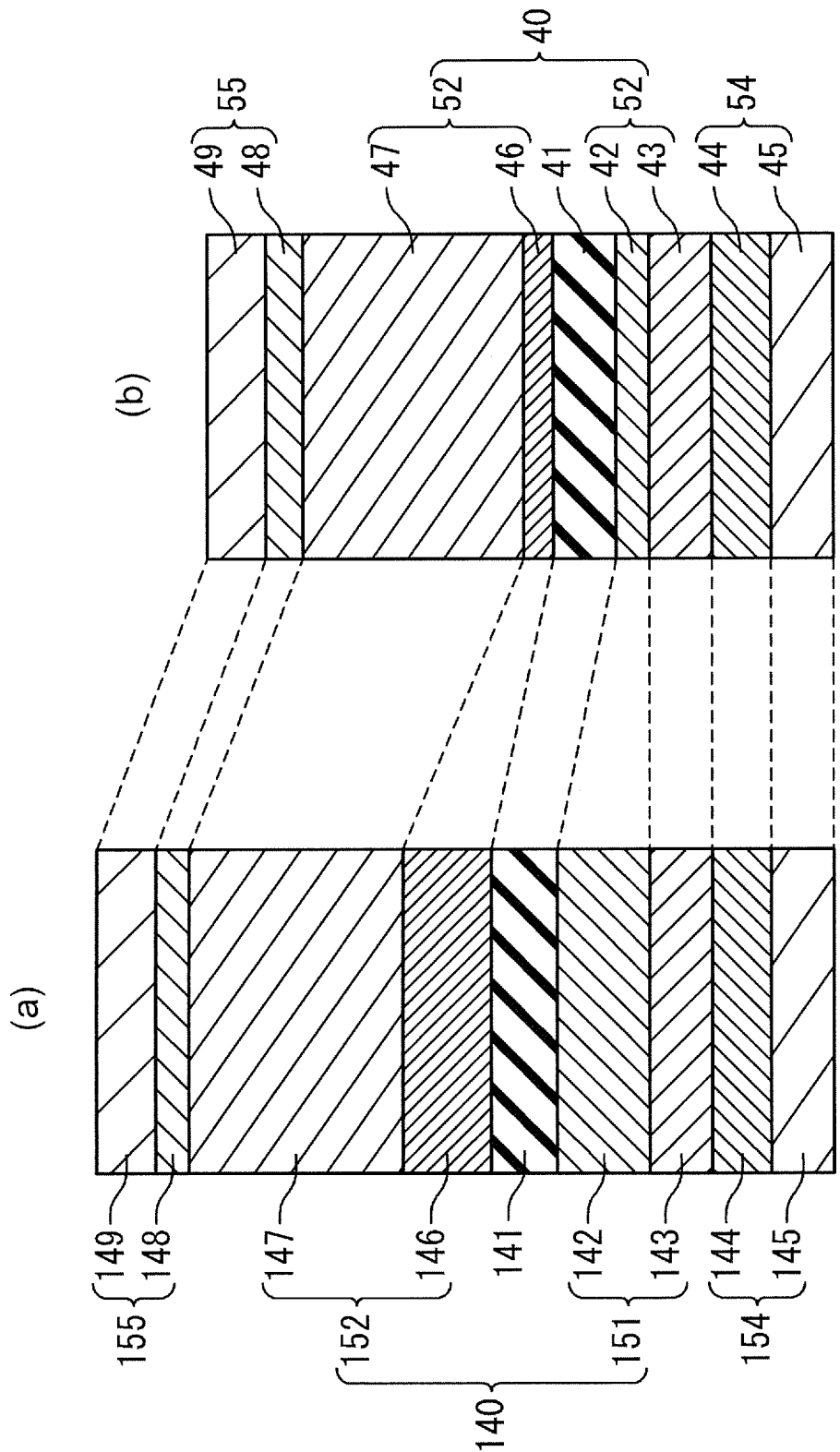
FIG. 3 is a sectional view schematically showing a concrete example and a comparative example of the resistance change element according to the first embodiment of the present invention.

A concrete example and a comparative example of a resistance change element according to the present embodiment are explained. FIG. 3 is a sectional view schematically showing a concrete example and a comparative example of a resistance change element according to the first embodiment of the present invention. The symbol (a) shows a comparative example and the symbol (b) shows a concrete example of a resistance change element according to the present embodiment.

Firstly, a manufacturing method of the specimen (a) as a comparative example is explained. Firstly, as a first wire 154, a metal layer 145 of Cu (copper) 50 nm in thickness and a barrier layer 144 of TaNx (tantalum nitride) 5 nm in thickness are stacked over a semiconductor (monocrystal silicon) substrate. Successively, as a lower electrode 151, a first outside electrode 143 of Ta (tantalum) 5 nm in thickness and a first interface electrode 142 of TiNx (titanium nitride) 10 nm in thickness are stacked over the first wire 154. Successively, as a resistance change layer 141, ZrOx (zirconium oxide) 6 nm in thickness is formed over the first interface electrode 142. Successively, as an upper electrode 152, a second interface electrode 146 of TiNx (titanium nitride) 10 nm in thickness and a second outside electrode 147 of Ta (tantalum) 50 nm in thickness are stacked over the resistance change layer 141. Finally, as a second wire 155, a barrier layer 148 of TaNx (tantalum nitride) 5 nm in thickness and a metal layer 149 of Cu (copper). 50 nm in thickness are stacked. As a method of forming the layers, any of a DC sputtering method, an RF sputtering method, a CVD method, and an ALD method may be adopted. In the specimen (a) thus manufactured, the film thickness of TiNx (titanium nitride) in the lower electrode 151 and the upper electrode 152 is relatively large. Consequently, resistance values of both the electrodes are relatively high.

A manufacturing method of the specimen (b) as a concrete example of a resistance change element according to the present embodiment is explained hereunder. Firstly, as a first wire 54, a metal layer 45 of Cu (copper) 50 nm in thickness and a barrier layer 44 of TaNx (tantalum nitride) 5 nm in thickness are stacked over a semiconductor (monocrystal silicon) substrate. Successively, as a lower electrode 51, a first outside electrode 43 of Ta (tantalum) 5 nm in thickness and a first interface electrode 42 of TiNx (titanium nitride) 2 nm in thickness are stacked over the first wire 54. Successively, as a resistance change layer 41, ZrOx (zirconium oxide) 6 nm in thickness is formed over the first interface electrode 42. Successively, as an upper electrode 52, a second interface electrode 46 of TiNx (titanium nitride) 2 nm in thickness and a second outside electrode 47 of Ta (tantalum), 50 nm in thickness are stacked over the resistance change layer 41. Finally, as a second wire 55, a barrier layer 48 of TaNx (tantalum nitride) 5 nm in thickness and a metal layer 49 of Cu (copper) 50 nm in thickness are stacked. As a method of forming the layers, any of a DC sputtering method, an RF sputtering method, CVD method, and an ALD method may be adopted. In the specimen (b) thus manufactured, the film thickness of TiNx (titanium nitride) in the lower electrode 51 and the upper electrode 52 is relatively small. Consequently, resistance values of both the electrodes are relatively low.

Figure 4A:
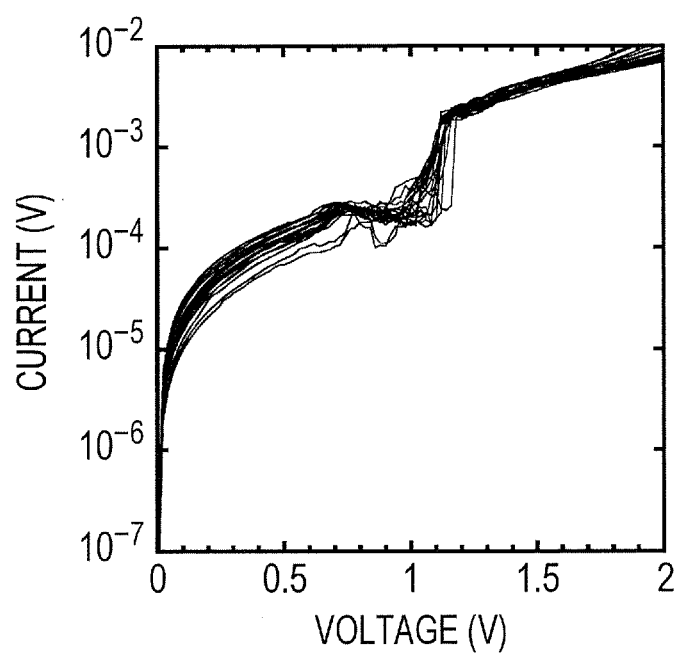
FIG. 4A is a graph showing a resistance change characteristic of the specimen (a) in FIG. 3.
Figure 4B:
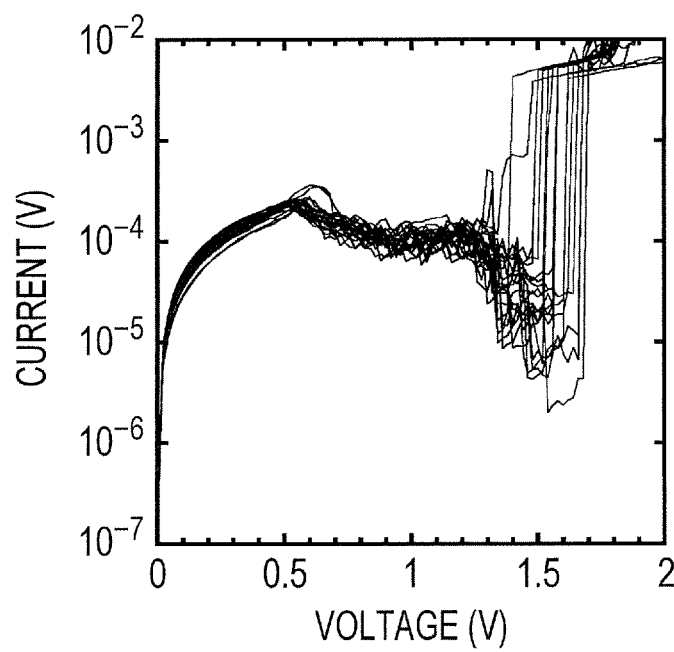
FIG. 4B is a graph showing a resistance change characteristic of the specimen (b) in FIG. 3.

The results of evaluating the resistance change characteristics of the specimens (a) and (b) stated above in FIG. 3 are explained hereunder. FIGS. 4A and 4B are graphs showing the resistance change characteristics of the specimens (a) and (b) in FIG. 3 respectively. The horizontal axis shows an applied voltage and the vertical axis shows a flowing electric current. Here, in each of the graphs, a plurality of resistance change operations are shown.

In either of the cases, firstly in order to form an electrically conductive filament at a part of a resistant random access layer 141 or 41, forming operation is carried out by grounding a first wire 154 or 54 and shifting the voltage of a second wire 155 or 55 from 0 V to 4 V. On this occasion, the flowing electric current is controlled to about 300 μA with an external power circuit (not shown in the figures) so that the resistance of a filament may not be excessively low. As a result, the resistance change element 141 or 41 has a resistance of about $3 \times 10^{+3} \Omega$.

Resistance increase operation is carried out by not applying electric current control but similarly applying a voltage. Resistance decrease operation is carried out by similarly applying a voltage not less than a resistance increase voltage. Supposedly if the resistance increase voltage and the resistance decrease voltage are values of the same level, resistance change between a high resistance state and a low resistance state cannot be achieved with a high degree of reliability. For example, resistance increase and resistance decrease occur simultaneously in resistance increase operation.

As shown in FIG. 4A, it is obvious that resistance increase occurs in the vicinity of 0.8 V and resistance decrease occurs in the vicinity of 1.1 V respectively in the resistance change operation of the specimen (a) in FIG. 3. The voltage margin between the resistance increase and the resistance decrease is only about 0.3 V. Consequently, if the existence of voltage variation is taken into consideration, it is very difficult to carry out resistance change operation with a high degree of reliability.

On the other hand, as shown in FIG. 4B, it is obvious that resistance increase occurs in the vicinity of 0.5 V and resistance decrease occurs in the vicinity of 1.5 V respectively in the resistance change operation of the specimen, (b) in FIG. 3. The voltage margin between the resistance increase and the resistance decrease is about 1.0 V. Consequently, even if the existence of voltage variation is taken into consideration, it is possible to carry out resistance change operation with a high degree of reliability.

As stated above, it is obvious that there is a large difference in resistance change characteristics between the specimen (a) and the specimen (b). As stated above, the difference between the two specimens lies in the film thicknesses of TiNx (titanium nitride) in a lower electrode and an upper electrode, namely the resistance values of a lower electrode and an upper electrode. It is obvious that the specimen (b) having a relatively small film thickness and a low resistance value has a better resistance change characteristic. The reasons (mechanisms) are explained hereunder.

Figure 5A:
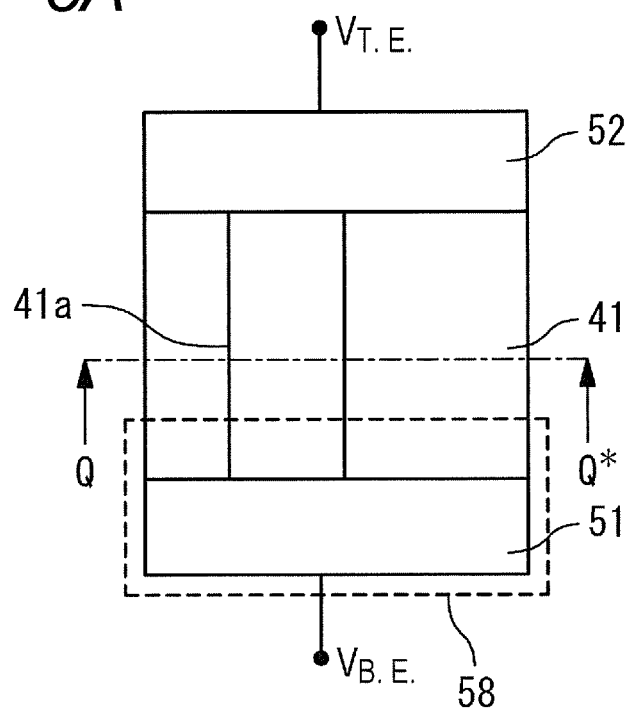
FIG. 5A is a schematic view explaining the relationship between an electrode resistance and a resistance change operation.
Figure 5B:
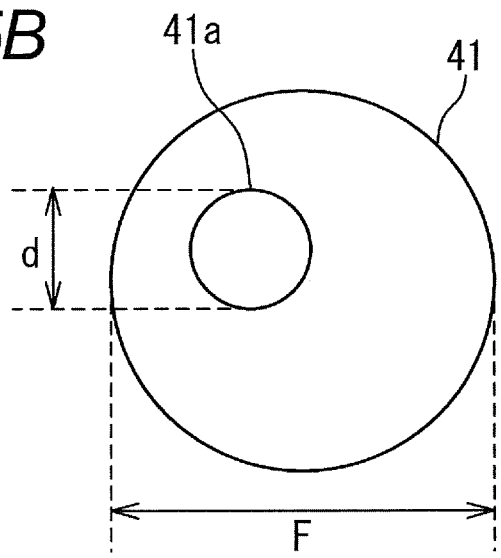
FIG. 5B is a schematic view explaining the relationship between an electrode resistance and a resistance change operation.
Figure 5C:
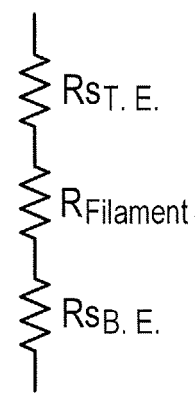
FIG. 5C is a schematic view explaining the relationship between an electrode resistance and a resistance change operation.
Figure 5D:
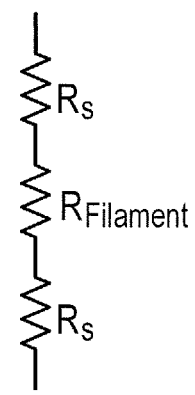
FIG. 5D is a schematic view explaining the relationship between an electrode resistance and a resistance change operation.

FIGS. 5A to 5D are schematic views explaining the relationship between a resistance of an electrode and resistance change operation. FIG. 5A is a side view of a resistance change element in a low resistance state and FIG. 5B is a sectional view of the resistance change element taken on line Q-Q* in FIG. 5A. FIGS. 5C and 5D are views showing equivalent circuits of the resistance change element in FIG. 5A.

As shown in FIGS. 5A and 5B, a resistance change element has a resistance change layer 41 having a filament 41a formed by initialization operation and an upper electrode 52 and a lower electrode 51 formed over and below the filament 41a respectively. Here, the diameter of the resistance change layer 41 is represented by F and the diameter of the filament 41a is represented by d. Here, when it is not necessary to distinguish an upper electrode 52 from a lower electrode 51, either of the electrodes is referred to simply as an electrode part 58.

A resistance $R_{MIN}$ of a MIN part (upper electrode 52/resistance change layer 41/lower electrode 51) in a resistance change element 40 in a low resistance state has to take, in addition to a resistance $R_{Filament}$ of a filament 41a, a resistance $Rs_{T.E.}$ of an upper electrode 52 and a resistance $Rs_{B.E.}$ of a lower electrode 51 coupled to it into consideration (FIG. 5C). That is, the expression $$R_{MIN} = R_{Filament} + Rs_{T.E.} + Rs_{B.E.} \quad (0)$$

holds. On this occasion, in the case where the resistance $Rs_{T.E.}$ and the resistance $Rs_{B.E.}$ of an upper electrode 52 and a lower electrode 51 are not negligible in comparison with the resistance $R_{Filament}$ of a filament 41a, the effective potential difference applied to the filament 41a is small to the extent of not being negligible in comparison with a voltage applied to a MIN part.

On this occasion, the relationship among the resistances $Rs_{T.E.}$ and $Rs_{B.E.}$ of electrodes and the resistance $R_{Filament}$ of a filament is presumably as follows.

[Numerical Expressions 1]

$$V_{Filament} = \frac{R_{Filament}}{R_{Filament} + R_{S_{T.E.}} + R_{S_{B.E.}}} \times V_{MIM} \quad (1)$$

$$V_{MIM} = \frac{R_{Filament} + R_{S_{T.E.}} + R_{S_{B.E.}}}{R_{Filament}} \times V_{Filament} \quad (2)$$

$$R_{S_{T.E.}} = R_{S_{B.E.}} = R_S \quad (3)$$

$$V_{Filament} = V_{RESET} \quad (4)$$

$$V_{MIM} = \frac{R_{Filament} + 2R_S}{R_{Filament}} \times V_{RESET} \quad (5)$$

$$V_{MIM} < V_{SET} \quad (6)$$

$$\frac{R_{Filament} + 2R_S}{R_{Filament}} \times V_{RESET} < V_{SET} \quad (7)$$

$$R_S < \left(\frac{V_{SET}}{V_{RESET}} - 1\right) \times \frac{R_{Filament}}{2} \quad (8)$$

As shown in Expression (1), a voltage $V_{Filament}$ applied to a filament 41a drops at both electrode parts 58 and hence comes to be lower than a voltage $V_{MIN}$ applied between an upper electrode 52 and a lower electrode 51. Consequently, as shown in Expression (2), in order to apply a voltage sufficient for resistance increase to the filament 41a, it is necessary to apply a higher voltage in consideration of the voltage drop at both the electrode parts 58. Supposedly the resistance of each of the electrode parts 58 is represented by Rs as shown in Expression (3) (FIG. 5D) and a voltage to be applied to the filament 41a for resistance increase is represented by $V_{RESET}$ as shown in Expression (4). Then a voltage $V_{MIN}$ to be applied between the upper electrode 52 and the lower electrode 51 during high resistance operation is represented by Expression (5) from Expressions (2) to (4). Obviously, the voltage $V_{MIN}$ (Expression (5)) necessary for high resistance operation has to be lower than a resistance decrease voltage $V_{SET}$ as shown in Expression (6). As a result, the relationship between the resistance Rs of each of the electrode parts 58 and the resistance $R_{Filament}$ of the filament 41a has to satisfy Expression (7). Expression (7) is modified and thus Expression (8) has to be satisfied. For example, when the voltage $V_{RESET}$ to be applied to the filament 41a for resistance increase is 0.5 V and the voltage $V_{SET}$ to be applied to the filament 41a for resistance decrease is 1.5 V, the expression $Rs < R_{Filament}$ holds from Expression (8). Consequently, it is impossible to control resistance change unless the resistance Rs of each of the electrode parts 58 is smaller than the resistance $R_{Filament}$ of the filament 41a. That is, it is necessary to decrease the resistance Rs of each of the electrode parts 58 so as to be sufficiently smaller than the resistance $R_{Filament}$ of the filament 41a in order to improve controllability in resistance change operation.

Figure 6:
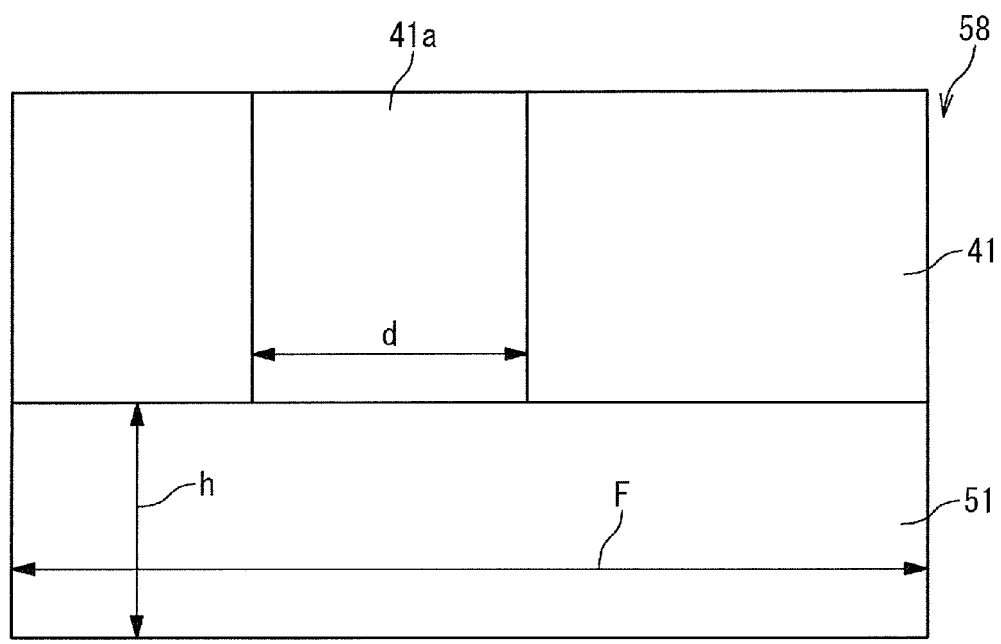
FIG. 6 is a schematic view showing an electrode part and the vicinity thereof.

Here, the resistance Rs of each of the electrode parts 58 is discussed further. FIG. 6 is a schematic view showing an electrode part and the vicinity thereof. Let's assume that a disk-shaped electrode part 58 touches a columnar conductive filament 41a as shown in FIG. 6. Further, the diameter of the filament 41a is defined as d, the length thereof as l, the diameter of the electrode part 58 as F, and the thickness thereof as h, respectively.

[Numerical Expressions 2]

$$R_S \equiv R_{Bulk} + R_{Sp} + R_{CO} \quad (9)$$

$$R_{Bulk} = \frac{1}{A}\int \rho(x)dx = \rho\frac{h}{A} \quad (10)$$

$$R_{Sp} = \frac{\rho}{\pi d}\tan^{-1}\left(\frac{4h}{d}\right) \quad (11)$$

$$R_{CO} = \frac{R_C}{S} \approx 0 \quad (12)$$

$$R_S \approx \rho\frac{h}{A} + \frac{\rho}{\pi d}\tan^{-1}\left(\frac{4h}{d}\right) \quad (13)$$

The resistance Rs of the electrode part 58 touching the filament 41a can be defined by being separated into three components; a bulk resistance $R_{Bulk}$, a spreading resistance $R_{Sp}$, and a contact resistance $R_{CO}$ of the electrode part 58, as shown in Expression (9). The bulk resistance $R_{Bulk}$ is a resistance of the material itself of the electrode part 58. The spreading resistance $R_{Sp}$ is a resistance when electric current flows from the filament 41a into the electrode part 58 and spreads from the filament 41a (a small sectional area) to the whole face of the electrode part 58 (a large sectional area) or a resistance in a reverse case. The contact resistance $R_{CO}$ is a contact resistance between the filament 41a and the electrode part 58.

The bulk resistance $R_{Bulk}$ of the electrode part 58 is described by the Ohm's law as shown in Expression (10) when a composition profile does not exist in the interior. Here, the resistivity of the electrode part 58 is defined as ρ and the sectional area of the electrode part 58 is represented by A ($=\pi F^2/4$). The spreading resistance $R_{Sp}$ depends on the thickness h and the resistivity ρ of the electrode part 58 and the diameter d of the filament 41a as shown in Expression (11). It is estimated that the contact resistance $R_{CO}$ is caused mainly by a Schottky barrier of the interface between the electrode part 58 and the filament 41a and the contact resistance $R_{CO}$ can be described as Expression (12). Since the current-voltage characteristic in a low resistance state is ohmic as the result of actual measurement however, it is estimated that the effect of the contact resistance is negligibly small ($R_{CO}\approx 0$). Consequently, the resistance Rs of the electrode part 58 is modeled as Expression (13).

Here, the value of the spreading resistance $R_{Sp}$ (Expression (14), redescription of Expression (11)) varies in accordance with the relationship between the thickness h of the electrode part 58 and the diameter d of the filament 41a.

[Numerical Expressions 3]

$$R_{Sp} = \frac{\rho}{\pi d}\tan^{-1}\left(\frac{4h}{d}\right), \quad (14)$$

$$S = \frac{\pi}{4}d^2,$$

$$A = \frac{\pi}{4}F^2$$

$$h \gg d \quad (15)$$

$$R_{Sp} = \frac{\rho}{2d}$$

$$h \ll d \quad (16)$$

$$R_{Sp} = \rho\frac{h}{S}$$

When the thickness h of the electrode part 58 is sufficiently larger than the diameter d of the filament 41a, Expression (14) is described as Expression (15). That is, the spreading resistance $R_{Sp}$ comes to be a quantity depending only on the diameter d of the filament 41a and the resistivity ρ of the electrode part 58. On the other hand, when the thickness h of the electrode part 58 is sufficiently smaller than the diameter d of the filament 41a, Expression (14) is described as Expression (16) using S as the sectional area of the filament 41a. That is, the spreading resistance $R_{Sp}$ comes to be a quantity depending on the sectional area S of the filament 41a and the resistivity ρ and the thickness h of the electrode part 58.

Figure 7:
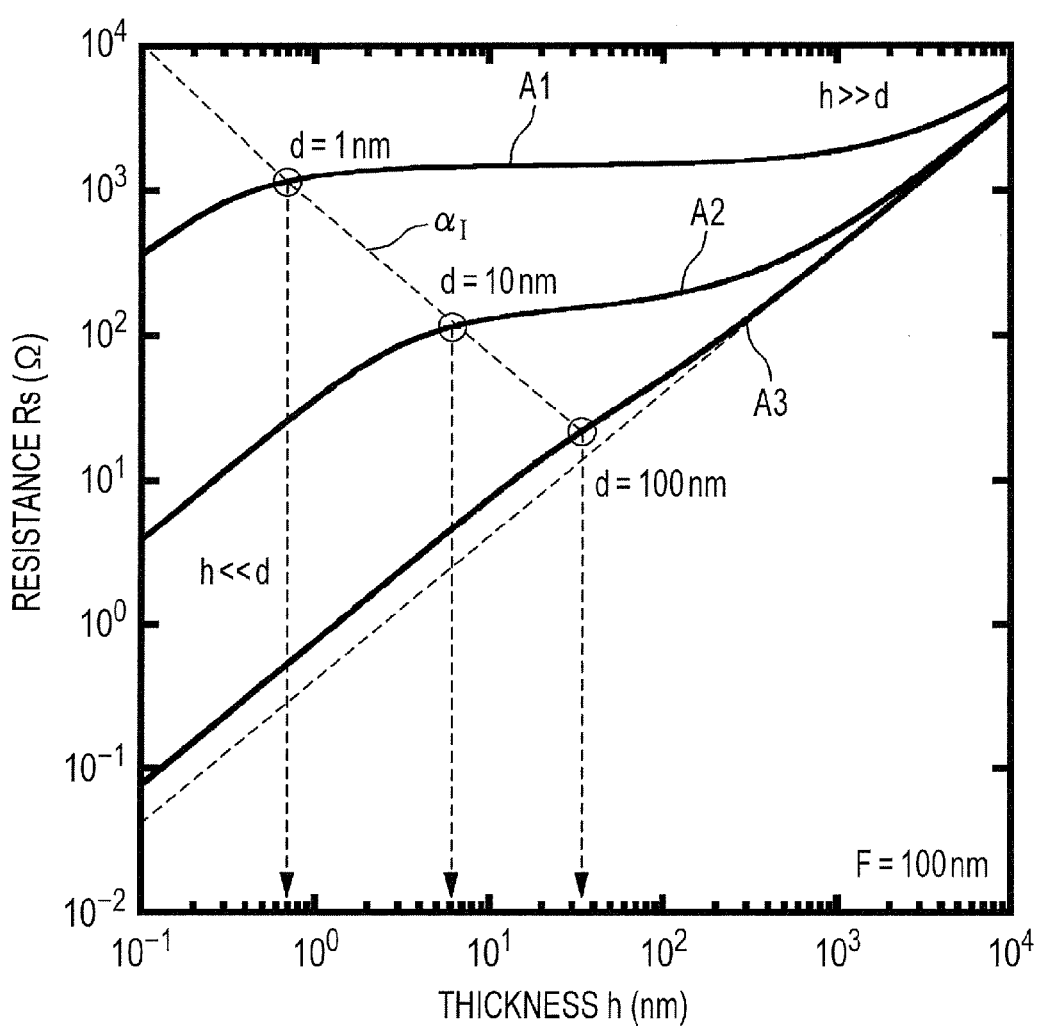
FIG. 7 is a graph showing the results of computing the resistances Rs of electrode parts.

The results of computing the resistances Rs of electrode parts 58 in Expression (13) in consideration of Expressions (14) to (16) are explained hereunder. FIG. 7 is a graph showing the results of computing the resistances Rs of electrode parts 58. The horizontal axis shows the thickness h of an electrode part 58 and the vertical axis shows the resistance Rs of an electrode part 58. The curved lines A1, A2, and A3 represent the thickness h dependency of the resistances Rs (Expression (13)) of electrode parts 58 when the diameters d of the filaments 41a are 1 nm, 10 nm, and 100 nm, respectively. On this occasion, it is assumed that the diameter F of the electrode parts 58 is 100 nm and the resistivity ρ thereof is 300 μΩcm (corresponding to TiNx).

For example, when the diameter d of a filament 41a is 10 nm (the curved line A2), the spreading resistance $R_{Sp}$ of an electrode part 58 is sufficiently larger than the bulk resistance $R_{Bulk}$ thereof in the region where the thickness h of the electrode part 58 is not more than 1 μm ($1\times10^3$ nm). Consequently, the resistance Rs of the electrode part 58 does not change largely in the region where the thickness h of the electrode part 58 is larger than the diameter d of the filament 41a, namely in the range from 10 ($1\times10^1$) nm to 1 μm ($1\times10^3$ nm). On the other hand, when the thickness h of an electrode part 58 is smaller than 10 ($1\times10^1$) nm, the resistance Rs of the electrode part 58 decreases in proportion to the thickness h of the electrode part 58. When the thickness h of an electrode part 58 is about 60% the diameter d of a filament 41a (h=about 6 nm in the curved line A2) in particular, the resistance Rs decreases conspicuously in accordance with the reduction of the thickness h of the electrode part 58. Here, the dotted line $\alpha_I$ shows a point where the resistance Rs of an electrode part 58 starts to decrease in proportion to the thickness h of the electrode part 58. The cases where the diameters d of filaments 41a are 1, 10, and 100 nm correspond the points where the thicknesses h of electrode parts 58 are 70%, 60%, and 40% of the diameters d of the filaments 41a, respectively. The diameter d of a filament 41a is at least 100 nm or less and hence a resistance value starts to decrease sharply by controlling the thickness h of an electrode part 58 to at least 80% or less.

Figure 8:
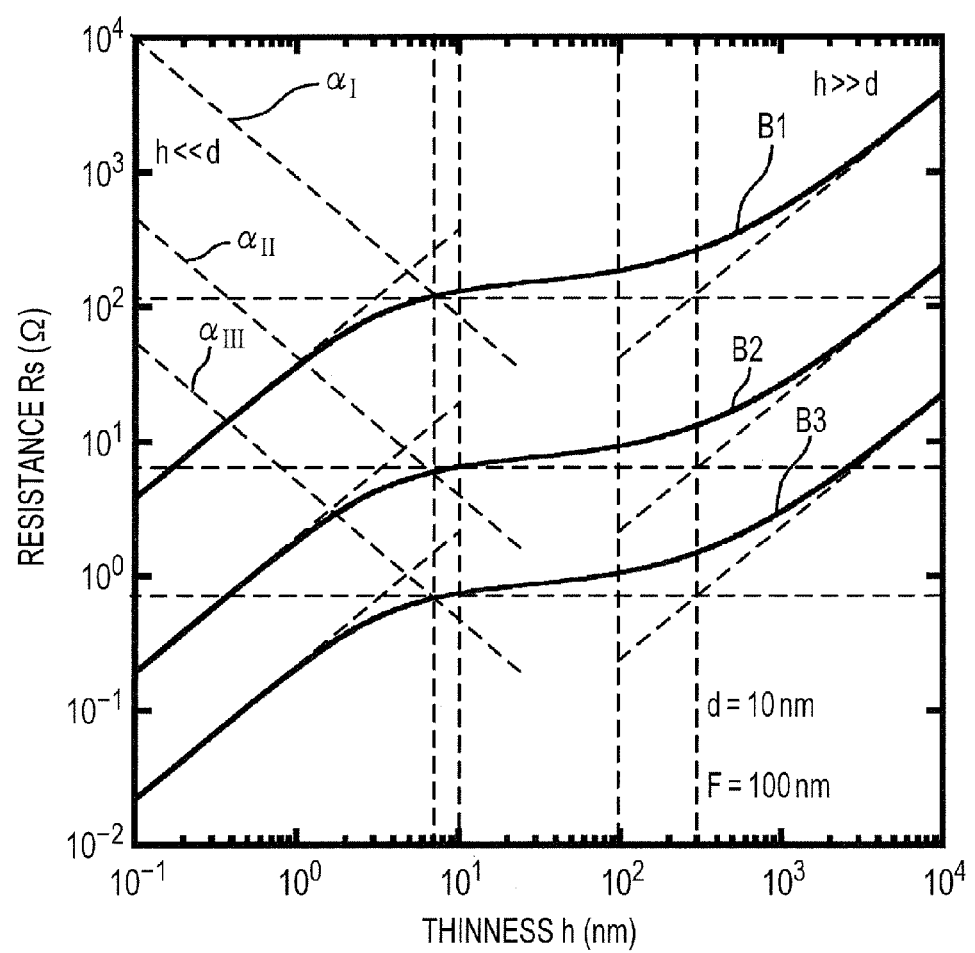
FIG. 8 is a graph showing the results of computing the resistances Rs of electrode parts.

FIG. 8 is a graph showing the results of computing the resistances Rs of electrode parts 58. The horizontal axis shows the thickness h of an electrode part 58 and the vertical axis shows the resistance Rs of an electrode part 58. The curved lines B1, B2, and B3 represent the thickness h dependency of the resistances Rs (Expression (13)) of electrode parts 58 when the resistivities ρ of the electrode parts 58 are 300 μΩcm (corresponding to TiNx), 15 μΩcm (corresponding to Ru), and 1.7 μΩcm (corresponding to Cu), respectively. On this occasion, it is assumed that the diameter F of the electrode parts 58 is 100 nm and the diameter d of the filaments 41a is 10 nm.

When the resistivity ρ of the material of an electrode part 58 is varied, the resistance Rs of an electrode part 58 is low when the resistivity ρ is low. Here, the dotted lines αI, αII, and αIII show the points where the resistances Rs of electrode parts 58 start to decrease in proportion to the thicknesses h of the electrode parts 58.

From the above results, in order to obtain a result like the specimen (b) having a relatively small film thickness and a low resistance value, it is preferable to select an electrode material having a low resistivity ρ when the diameter d of a filament 41a is identical, namely when a resistance value in a low resistance state is identical. Further, it is preferable to control the thickness h of an electrode part 58 to 80% or less of the diameter of a filament 41a. In this way, the controllability of resistance change improves and resultantly a resistance change element having a high degree of reliability is materialized. A resistivity ρ here means the resistivity of a whole electrode part 58. Consequently, in the case of resistance change element 40 of the specimen (b) in FIGS. 2 and 3, with regard to a lower electrode 51, that means an average resistivity of a first interface electrode 42 and a first outside electrode 43 which configure the lower electrode 51. With regard to an upper electrode 51, that means an average resistivity of a second interface electrode 46 and a second outside electrode 47 which configure the upper electrode 52.

In a resistance change element according to the present embodiment, at least an electrode on one side of a lower electrode 51 and an upper electrode 52 is formed so as to have a double-layered structure, a hardly oxidizable electrode is used as an interface electrode on the side of the interface with the resistance change element, and a low resistance electrode is used as an outside electrode on the outside thereof. In this way, it is possible to decrease a resistance at an electrode so as to be sufficiently lower than a resistance at a resistance change element (filament). As a result, it is possible to improve the controllability of resistance change operation.

Second Embodiment

Figure 9:
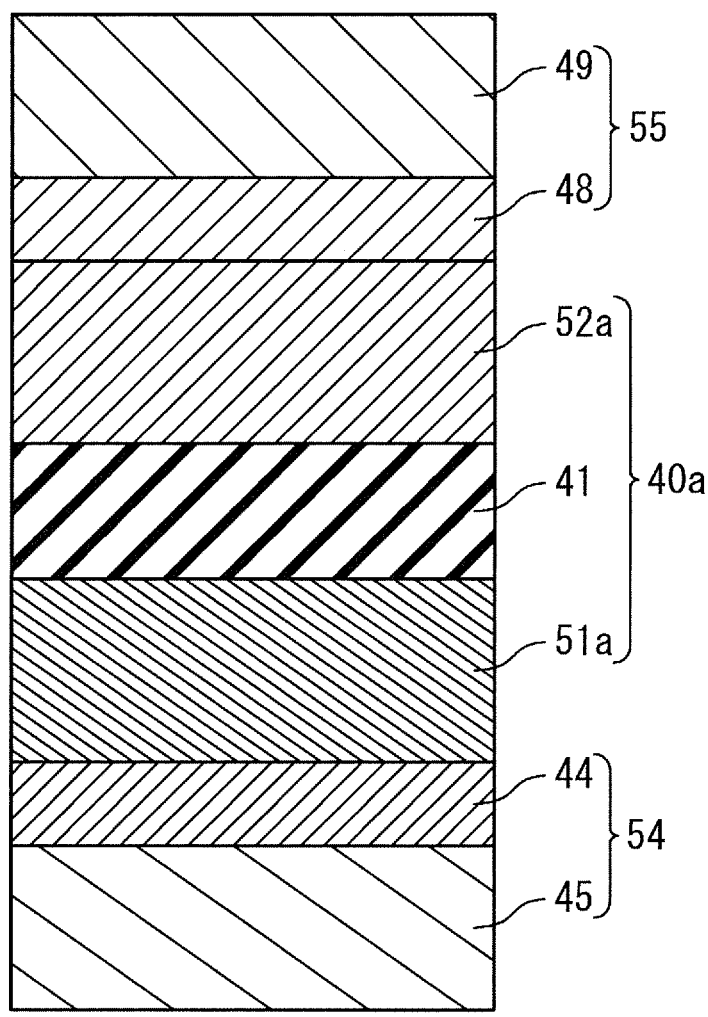
FIG. 9 is a sectional view schematically showing a configuration example of a resistance change element in a nonvolatile semiconductor memory device according to a second embodiment of the present invention.

A nonvolatile semiconductor memory device according to the second embodiment of the present invention is explained. FIG. 9 is a sectional view schematically showing a configuration example of a resistance change element in a nonvolatile semiconductor memory device according to the second embodiment of the present invention. In a resistance change element 40a according to the present embodiment, the configuration of a lower electrode 51a and an upper electrode 52a is different from the configuration of the lower electrode 51 and the upper electrode 52 in the first embodiment in comparison with the resistance change element 40 according to the first embodiment. The different points are mainly explained hereunder.

The resistance change element 40a memorizes information by changing a resistance value. It has a resistance change layer 41 and a lower electrode 51a and an upper electrode 52a formed at both the ends.

The lower electrode 51a comprises an electrically conductive material not containing a precious metal and has a resistivity gradient in the interior thereof. That is, the lower electrode 51a is formed so that the resistivity on the side of the resistance change layer 41 may be high and the resistivity on the side of a first wire 54 may be low. In the middle, the resistivity shifts from a high value to a low value from the side of the resistance change layer 41 toward the side of the first wire 54. For example, a nitride of a metal is used on the side of the resistance change layer 41 and a simple substance of the metal is used on the side of the first wire 54. In the middle, nitrogen in the metal shifts from a high concentration to a low concentration from the side of the resistance change layer 41 toward the side of the first wire 54. For example, TiNx is used on the side of the resistance change layer 41 and Ti is used on the side of the first wire 54. In the middle, X in $Ti_{1-X}N_X$ shifts from 0.5 to 0 from the side of the resistance change layer 41 toward the side of the first wire 54. The shift may be either continuous or multistepwise.

On this occasion, a nitride of a metal has a relatively high resistivity and is a material hardly oxidized in comparison with an element contained in the resistance change layer 41. That is, the side of the lower electrode 51a touching the resistance change layer 41 is regarded as the first interface electrode (42) in the first embodiment. Meanwhile, a metal simple substance is a material having a relatively low resistivity in comparison with a nitride of the metal. That is, the side of the lower electrode 51a touching the first wire 54 is regarded as the first outside electrode (43) in the first embodiment. Consequently, the lower electrode 51a can be regarded as a pseudo double-layered structure having a resistivity gradient and comprising the first interface electrode (42) and the first outside electrode (43). Here on this occasion, in both the first interface electrode (42) and the first outside electrode (43), the compositions in the films are not uniform and vary stepwise.

The material of the lower electrode 51a is, as already described in the first embodiment, an electrically conductive material not containing a precious metal and is a material hardly oxidized in comparison with an element contained in the resistance change layer 41. The material already described in the first embodiment can be used. In the present embodiment however, a metal and a nitride thereof, an oxide thereof, or a carbide thereof is used. In particular, it is preferable to use a transition metal and a nitride thereof. The examples are Ti and TiNx, Ta and TaNx, W and WNx, etc.

As a method for manufacturing the lower electrode 51a for example, a method of nitride the side of a metal film used as the lower electrode 51a touching the resistance change layer 41 is feasible. This is because the first interface electrode (42) may be thin as already described in the first embodiment. Otherwise, a method of forming a nitride film of a metal by introducing and increasing a nitrogen gas as the processed plane comes closer to the side touching the resistance change layer 41 while the metal film used for the lower electrode 51a is formed by a sputtering method or the like is feasible.

Others are similar to the first interface electrode 42 and the first outside electrode 43 in the first embodiment.

The upper electrode 52a may be the same as the one in the first embodiment or preferably may have the same configuration as the lower electrode 51a. When it has the same configuration as the lower electrode 51a, a method of forming a metal film by reducing a nitrogen gas as the processed plane gets away from the side touching the resistance change layer 41 and finally stopping the nitrogen gas while the nitride film of the metal used for the lower electrode 51a is formed by a sputtering method using a nitrogen gas or the like is feasible.

On this occasion too, effects similar to those in the first embodiment can be obtained. Further, since it is not necessary to stack two layers as both the electrodes, the manufacturing process is facilitated.

Third Embodiment

Figure 10:
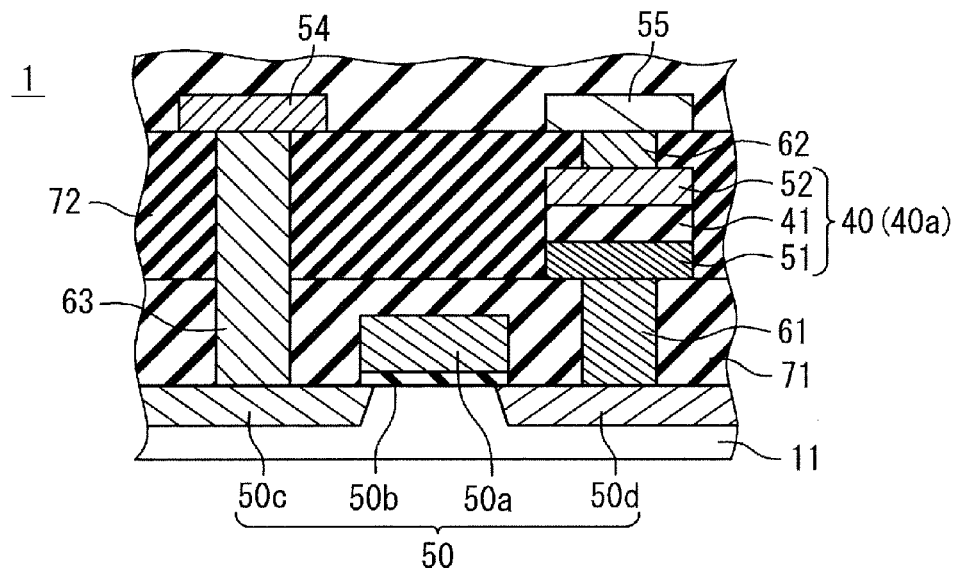
FIG. 10 is a sectional view showing a configuration example of a cell array in a nonvolatile semiconductor memory device according to a third embodiment of the present invention.

A nonvolatile semiconductor memory device according to the third embodiment of the present invention is explained. FIG. 10 is a sectional view showing a configuration example of a nonvolatile semiconductor memory device according to the third embodiment of the present invention. A nonvolatile semiconductor memory device 1 according to the present embodiment has a memory cell 70 including a resistance change element 40 in the first embodiment (or a resistance change element 40a in the second embodiment). In the figure here, descriptions on circuits for supplying and charging electric current and voltage are omitted (the same is true hereunder).

The nonvolatile semiconductor memory device 1 has a plurality of first wires 54, a plurality of second wires 55, a plurality of third wires (not shown in the figure), and a plurality of memory cells 70. In the figure however, one memory cell 70 and the vicinity thereof are shown and hence only one first wire 54, one second wire 55, and one memory cell 70 are shown.

The plural first wires 54 are wires to be bit lines and extend in the X direction in parallel with each other for example. The plural second wires 55 are grounded wires and extend in the X direction in parallel with each other for example. The plural third wires (not shown in the figure) are wires to be word lines and extend in the Y direction in parallel with each other for example. The plural memory cells 70 are formed at the respective intersections of the plural first wires 54 and the plural third wires (not shown in the figure). A memory cell 70 has a transistor 50 and a resistance change element 40 (or 40a).

The transistor 50 is a control transistor and is exemplified by a MOS transistor. The transistor 50 is formed in the surface region of a semiconductor substrate 11 comprising p-type monocrystal silicon. The transistor 50 has a gate 50a, a gate insulation layer 50b, a source 50c, and a drain 50d. Over the transistor 50, an interlayer insulation layer 71 is formed so as to cover it.

The resistance change element 40 (or 40a) is formed over the interlayer insulation layer 71. The resistance change element 40 has a lower electrode 51, a resistance change layer 41, and an upper electrode 52 and is as described in the first embodiment (or the second embodiment). The lower electrode 51 and the upper electrode 52 have a laminated structure comprising TiNx and W for example. The resistance change layer 41 comprises ZrOx for example. The lower electrode 51 is coupled to the drain 50d through a contact via 61 penetrating the interlayer insulation film 71. Over the resistance change element 40 and the interlayer insulation layer 71, an interlayer insulation film 72 is formed so as to cover them.

The first wire 54 is coupled to the source 50c through a contact via 63 penetrating the interlayer insulation layers 71 and 72. The second wire 55 is coupled to the upper electrode 52 through a via 62 formed in the interlayer insulation layer 72. The third wire (not shown in the figure) is coupled to the gate 50a in the vicinity of the memory cell 70.

Here, the control transistor stated above (transistor 50) is an n-type field effect transistor (nFET). However it may also be a p-type field effect transistor (pFET). The gate insulation layer 50b may comprise $SiO_2$ (silicon oxide) for example. The gate insulation layer 50b can be formed by thermally oxidizing the surface of the semiconductor substrate 11 for example. Otherwise, it may comprise a metal oxide such as HfOx (hafnium oxide), ZrOx (zirconium oxide), or AlOx (aluminum oxide). Further, it may also comprise silicate or nitride or may be a laminated structure of them.

The gate 50a can comprise phosphor-added polysilicon for example. It may however be a metal gate or a silicide gate. The lower electrode 51 and the upper electrode 52 can be configured by a laminated structure of TiNx 2 nm in thickness and W 5 nm in thickness for example. As stated above however, a material described in the first embodiment can be used for the electrodes. Further, the resistance change layer 41 can comprise ZrOx 10 nm in thickness. A material described in the first embodiment can also be used however.

A method for operating a nonvolatile semiconductor memory device 1 described in FIG. 10 (method for operating a resistance change element 40 or 40a) is explained hereunder. Firstly, in order to carry out "forming", for example, a transistor 50 is set in the state of "ON" by applying a positive voltage to a gate 50a, a positive voltage is applied to a first wire 54 and a positive voltage is applied to a lower electrode 51, and the resistance of a resistance change layer 41 is lowered. On this occasion, the voltage applied to the gate 50a is adjusted so that the electric current may be restricted by the transistor 50 and the resistance change layer 41 may take a desirable resistance value. Here, in "forming", voltage may be applied to a second wire 55 instead of the first wire 54.

When a low resistance state and a high resistance state are switched after "forming" too, a prescribed positive voltage is applied to the first wire 54 while the transistor 50 is in the state of "ON". When a resistance is changed from a low resistance state to a high resistance state, a voltage lower than the voltage of changing the resistance to a low resistance state is applied to the first wire 54. The voltage applied to the gate 50a is adjusted so that electric current may not be restricted by the transistor 50. On the other hand, when a resistance is changed from a high resistance state to a low resistance state, a voltage higher than the voltage of changing the resistance to a high resistance state is applied to the first wire 54. On this occasion, the voltage applied to the gate 50a is adjusted so that electric current may be restricted by the transistor 50 and the resistance change layer 41 may take a desirable (prescribed) resistance value. Here, when a resistance is changed from a high resistance state to a low resistance state, it is also possible to apply a positive voltage to the second wire 55 instead of the first wire 54.

A manufacturing method of a nonvolatile semiconductor memory device 1 is explained hereunder. FIGS. 11A to 11F are sectional views showing a manufacturing method of a nonvolatile semiconductor memory device according to the third embodiment of the present invention.

Figure 11A:
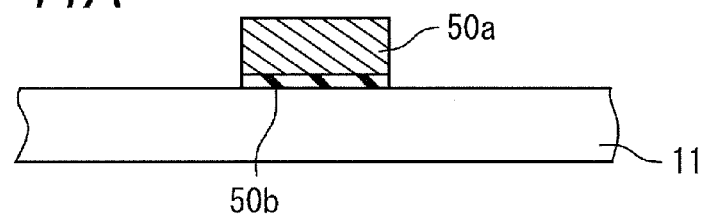
FIG. 11A is a sectional view showing a manufacturing method of a nonvolatile semiconductor memory device according to the third embodiment of the present invention.

Firstly as shown in FIG. 11A, a gate insulation layer 50b and a gate 50a are formed over a semiconductor substrate 11. For example, an $SiO_2$ (silicon oxide) film and a p-doped polysilicon (phosphor-added polysilicon) film are deposited and the films are patterned by using known lithography technology and etching technology. In this way, the gate insulation layer 50b and the gate 50a are formed.

Figure 11B:
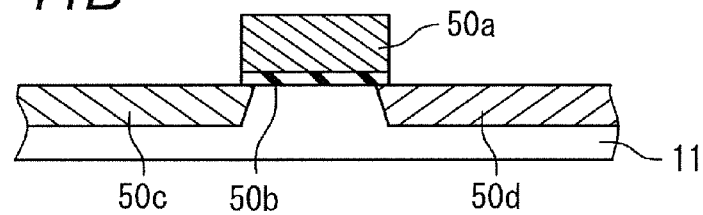
FIG. 11B is a sectional view showing the manufacturing method of the nonvolatile semiconductor memory device according to the third embodiment of the present invention.

Successively as shown in FIG. 11B, a source 50c and a drain 50d are formed by implanting P (phosphor) at $2 \times 10^{15}$ $cm^{-2}$ (a set value) while the gate 50a is used as a mask.

Figure 11C:
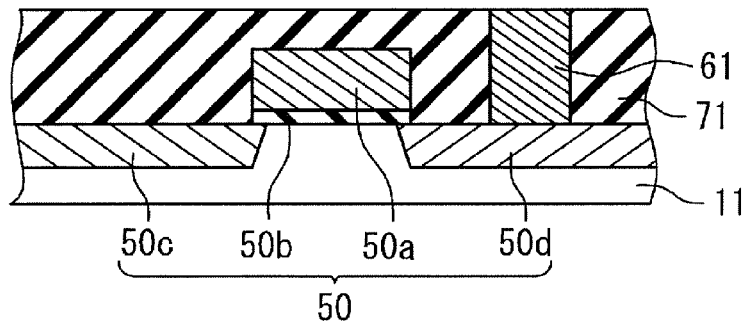
FIG. 11C is a sectional view showing the manufacturing method of the nonvolatile semiconductor memory device according to the third embodiment of the present invention.

Successively as shown in FIG. 11C, SiO$_2$ (silicon oxide) is deposited over the whole face of the semiconductor substrate 11, the surface of the deposited film is flattened by a CMP (Chemical Mechanical Polishing) method, and thus an interlayer insulation layer 71 is formed. Successively, a contact hole reaching the drain 50d is formed in the interlayer insulation layer 71 by using known lithography technology and etching technology. Successively, the interior of the contact hole is filled by stacking TiNx (titanium nitride) and W (tungsten). Successively, a contact via 61 is formed by removing the stacked films over the interlayer insulation layer 71 by using a CMP method.

Figure 11D:
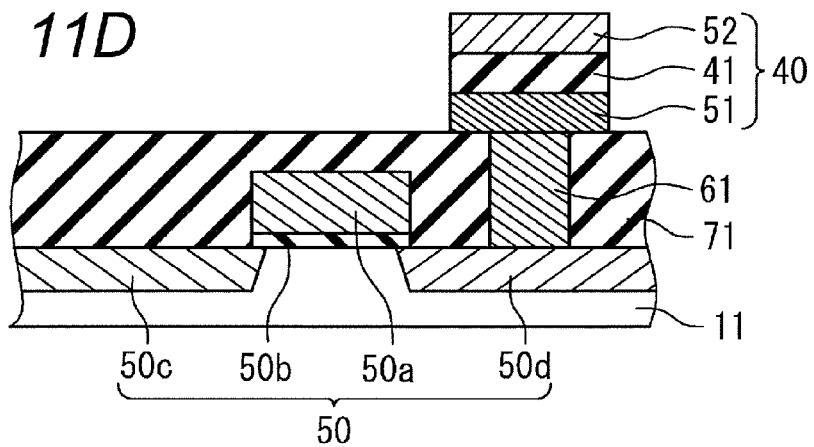
FIG. 11D is a sectional view showing the manufacturing method of the nonvolatile semiconductor memory device according to the third embodiment of the present invention.

Successively as shown in FIG. 11D, a W (tungsten) layer of 5 nm, a TiNx (titanium nitride) layer of 5 nm, a ZrOx (zirconium oxide) layer of 10 nm, a TiNx (titanium nitride) layer of 5 nm, and a W (tungsten) layer of 5 nm are deposited in sequence over the interlayer insulation layer 71 where the contact via 61 is formed and they are patterned by known lithography technology and etching technology. In this way, a resistance change element 40 comprising a lower electrode 51, a resistance change layer 41, and an upper electrode 52 is formed.

Figure 11E:
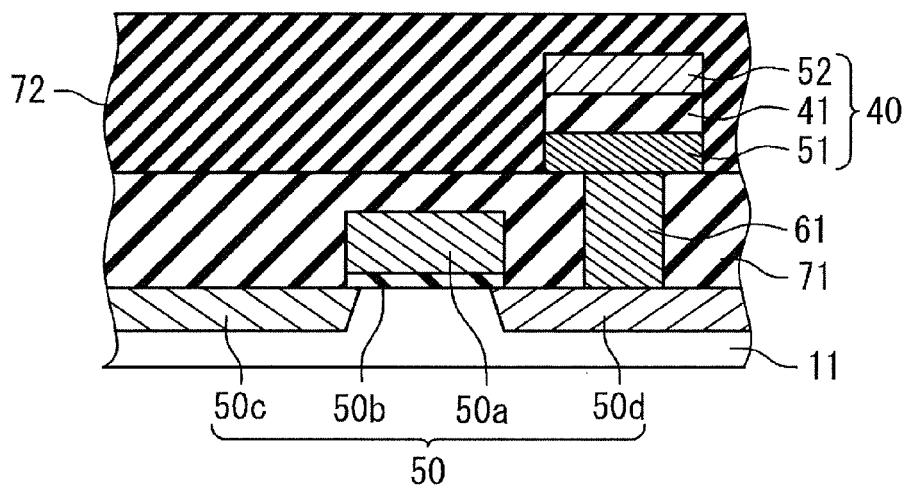
FIG. 11E is a sectional view showing the manufacturing method of the nonvolatile semiconductor memory device according to the third embodiment of the present invention.

Successively as shown in FIG. 11E, SiO$_2$ (silicon oxide) is deposited so as to cover the resistance change element 40 and the interlayer insulation layer 71 and an interlayer insulation layer 72 is formed by flattening the surface of the deposited film by a CMP method.

Figure 11F:
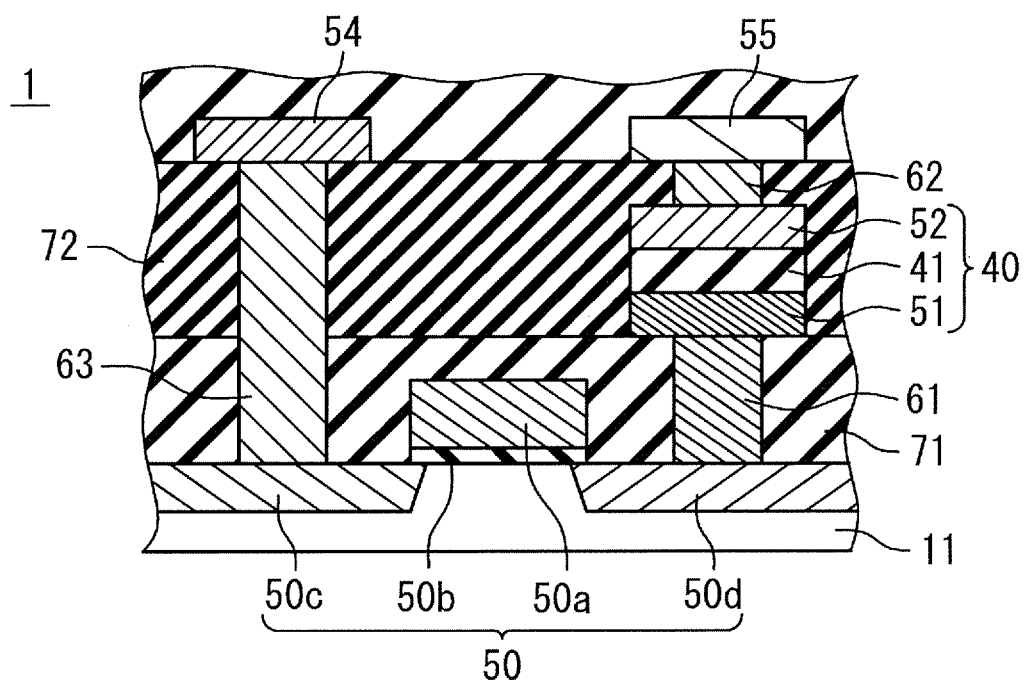
FIG. 11F is a sectional view showing the manufacturing method of the nonvolatile semiconductor memory device according to the third embodiment of the present invention.

Successively as shown in FIG. 11F, a through-hole reaching the source 50c and a through-hole reaching the upper electrode 52 are formed in the interlayer insulation layer 72 and the interlayer insulation layer 71 by patterning using known lithography technology and etching technology. Successively, TiN (titanium nitride) and W (tungsten) are deposited and the interiors of the through-holes are filled with them. Successively, the surface is flattened by using a CMP method and the titanium nitride and the tungsten other than those in the through-holes are removed. In this way, a contact via 63 and a via 62 are formed. Successively, TiNx (titanium nitride) and Al (aluminum) are deposited over the interlayer insulation layer 72 and a first wire 54 and a second wire 55 are formed by patterning the deposited films by known lithography technology and etching technology.

In a nonvolatile semiconductor memory device 1 manufactured as stated above, a resistance change element 40 (or 40a) according to the first embodiment (or the second embodiment) is coupled to a drain 50d of a transistor 50. Consequently, the area occupied by a memory cell 70 is only the area occupied by the transistor 50 and hence that is advantageous to higher integration. Further, in a nonvolatile semiconductor memory device 1, in addition to the features of the present invention in that the initial leak is small and stable resistance change operation can be materialized, electric current can be controlled by the gate voltage of a transistor 50 when voltage is applied for "forming" or resistance is changed from a high resistance to a low resistance and hence resistance change operation of low variation can be materialized.

Fourth Embodiment

Figure 12:
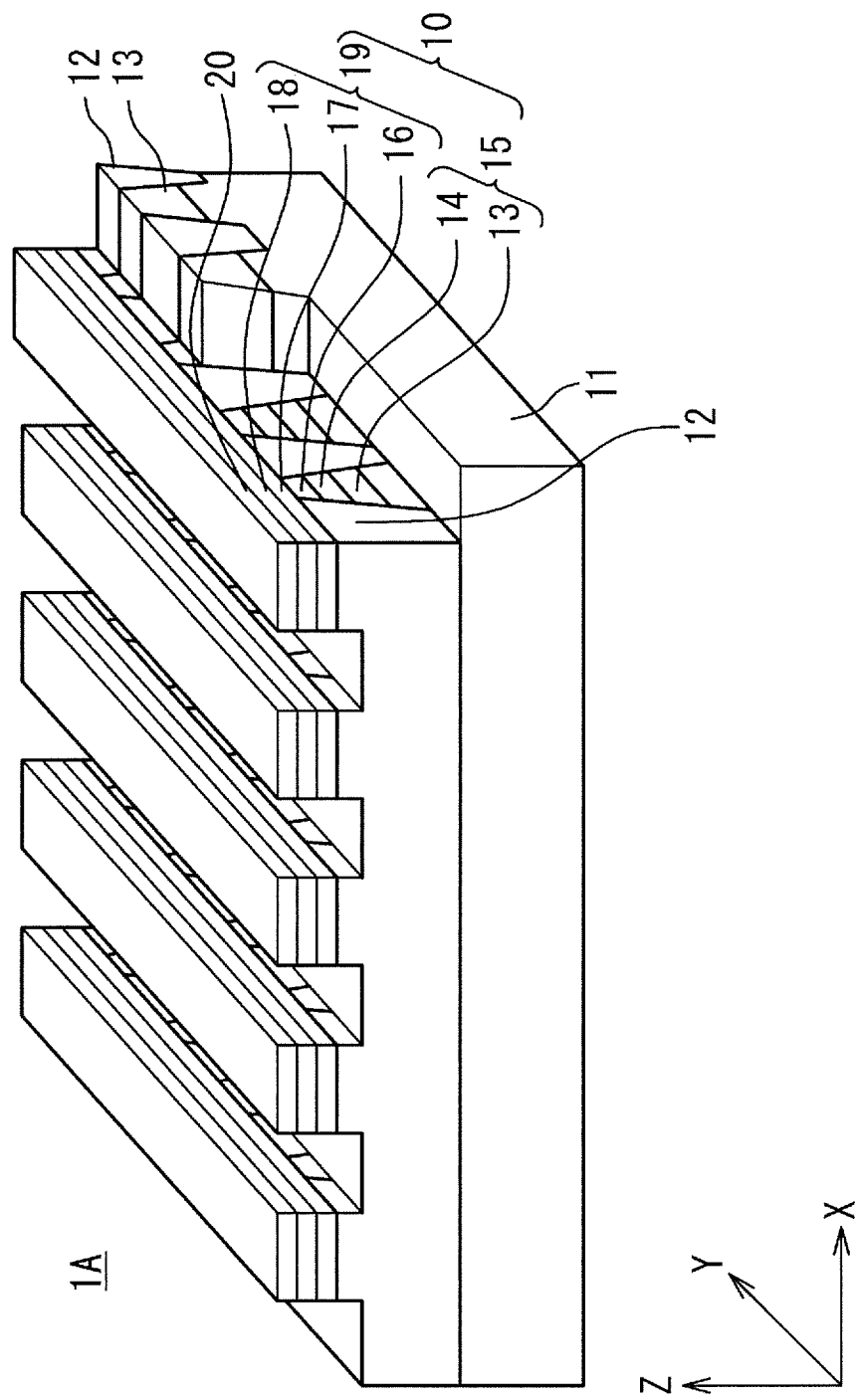
FIG. 12 is a perspective view schematically showing a configuration example of a nonvolatile semiconductor memory device according to a fourth embodiment of the present invention.

A nonvolatile semiconductor memory device according to the fourth embodiment of the present invention is explained. FIG. 12 is a perspective view schematically showing a configuration example of a nonvolatile semiconductor memory device according to the fourth embodiment of the present invention. A nonvolatile semiconductor memory device 1A is a nonvolatile resistance random access memory (ReRAM) and has a plurality of bit lines 13, a plurality of word lines 20, and a plurality of memory cells 10. In the figure here, descriptions on circuits for supplying and charging electric current and voltage are omitted.

The plural bit lines 13 extend in the X direction in parallel with each other. The plural bit lines 13 are embedded into a substrate 11. The plural word lines 20 extend in the Y direction perpendicular to the X direction in parallel with each other. The bit lines 13 and the word lines 20 are the first wires 54 and the second wires 55 in the first and second embodiments respectively for example. The plural memory cells 10 are formed at the respective intersections of the plural bit lines 13 and the plural word lines 20. Each of the memory cells 10 is coupled to a bit line 13 at one end and a word line 20 at the other end. Each of the memory cells 10 has a diode 15 and a resistance change part 19 coupled in series. That is, the memory cells 10 have an 1D1R structure.

A diode 15 has a rectification function. It is formed over a bit line 13. It includes a first semiconductor layer 13 and a second semiconductor layer 14. The first semiconductor layer 13 is, formed in contact with a bit line 13. The second semiconductor layer 14 is embedded into the interior of the first semiconductor layer 13 and formed in contact with a resistance change part 19. Either of the first semiconductor layer 13 and the second semiconductor layer 14 is an anode and the other thereof is a cathode.

A resistance change part 19 memorizes information by changing a resistance value. It is formed above a diode 15. The resistance change part 19 is a resistance change element 40 or 40a in the first or second embodiment. It includes an upper electrode 18, a lower electrode 16, and a resistance change layer 17. The upper electrode 18 is coupled to a word line 20. The lower electrode 16 is coupled to the diode 15. The resistance change layer 17 is formed between the upper electrode 18 and the lower electrode 16 and changes a resistance value by voltage (electric current) applied to both the electrodes. The lower electrode 16, the resistance change layer 17, the upper electrode 18, and the word line 20 are stacked in this order.

The upper electrode 18, the lower electrode 16, and the resistance change layer 17 are the upper electrode 52, the lower electrode 51, and the resistance change layer 41 respectively in the first embodiment or the upper electrode 52a, the lower electrode 51a, and the resistance change layer 41 respectively in the second embodiment. That is, at least either of the upper electrode 18 and the lower electrode 16 has either a double-layered structure of an interface electrode and an outside electrode in the same manner as the first embodiment or a pseudo double-layered structure having a resistivity gradient in the same manner as the second embodiment.

The details of a nonvolatile semiconductor memory device 1A are explained hereunder. FIG. 13A is a plan view of a configuration example (FIG. 12) of a nonvolatile semiconductor memory device according to the fourth embodiment of the present invention. A memory cell 10 is the region shown with the dotted line. Both the widths of the region in the X and Y directions are 2F if both the widths of a word line 20 and a bit line 13 are a minimum work size F. That is, the area of the memory cell 10 is $(2F)^2=4F^2$ and is a minimum unit cell area. In this way, the memory cell 10 has an 1D1R structure and makes the minimum unit cell area possible.

Figure 13B:
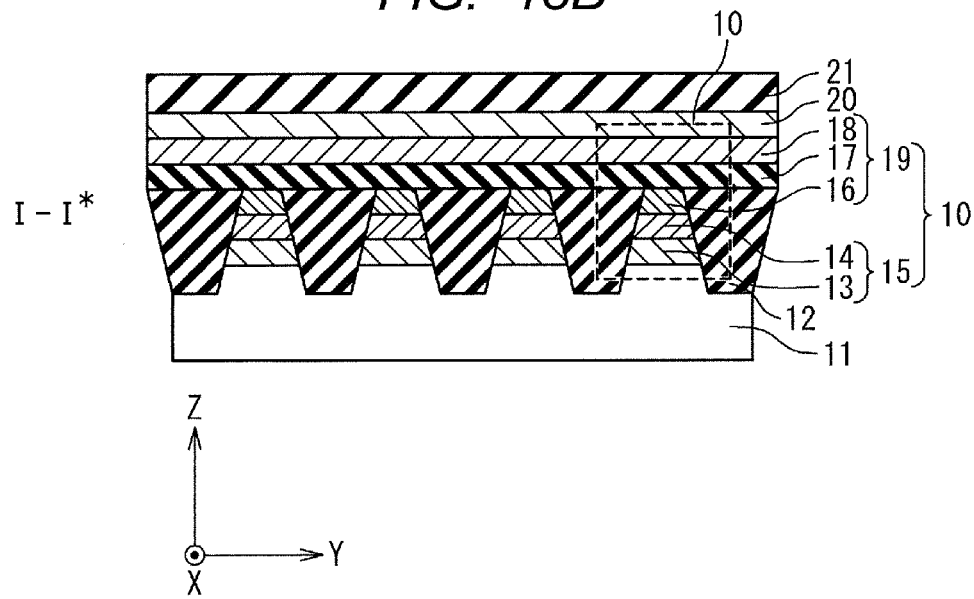
FIG. 13B is a sectional view taken on line I-I* in FIG. 13A.

FIGS. 13B to 13E are sectional views taken on lines I-I*, and IV-IV* of FIG. 13A, respectively. Here, the I-I* section is a yz section including a word line 20. The II-II* section is a yz section not including a word line 20. The section is an xz section including a bit line 13. The IV-IV* section is an xz section not including a bit line 13.

Figure 13C:
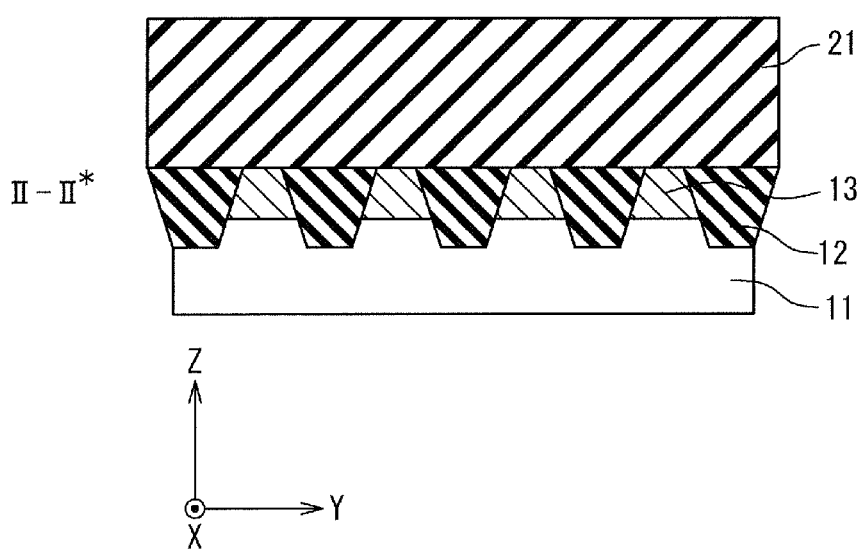
FIG. 13C is a sectional view taken on line II-II* in FIG. 13A.
Figure 13E:
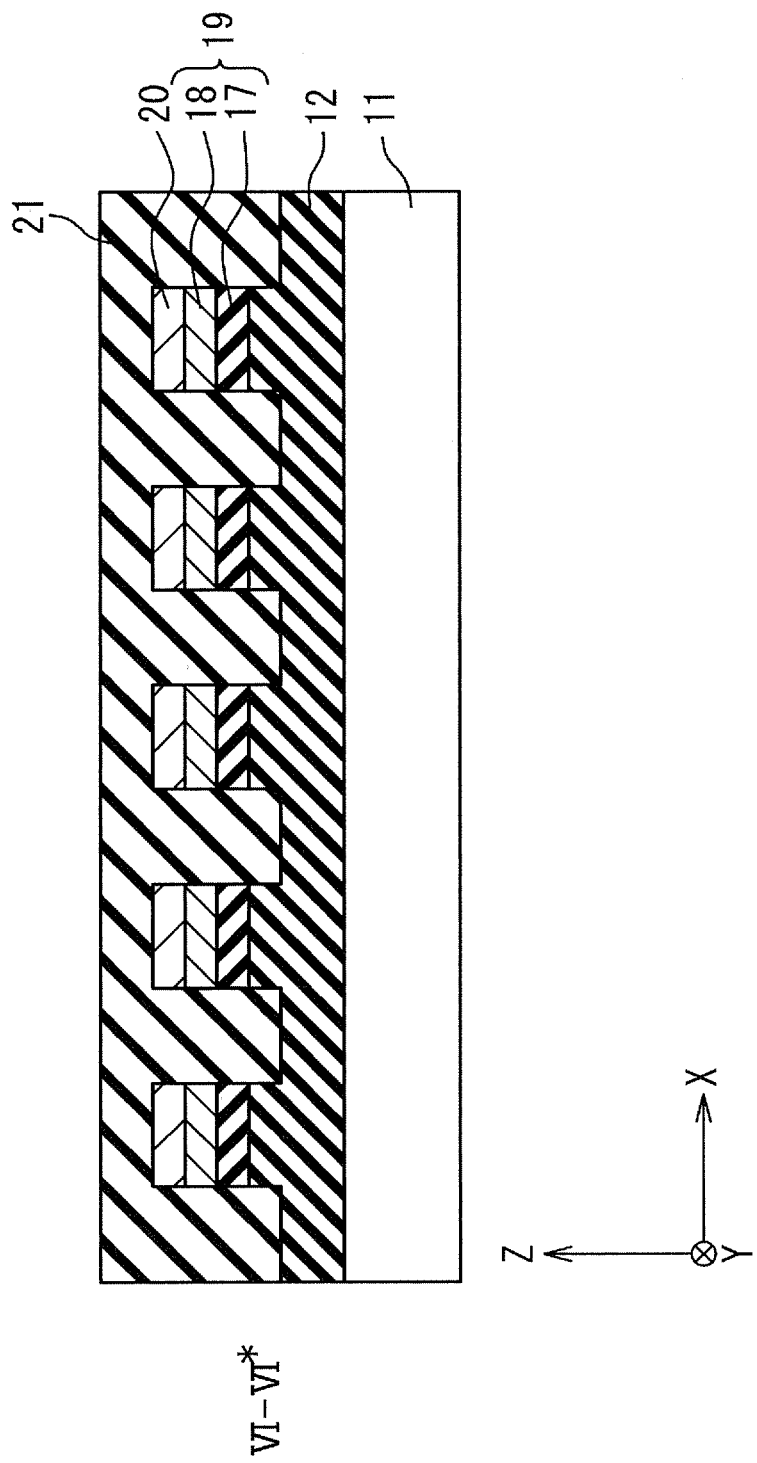
FIG. 13E is a sectional view taken on line IV-IV* in FIG. 13A.

A substrate 11 is a second conduction type semiconductor substrate and is exemplified by a p-type Si (silicon) substrate. The substrate 11 has a plurality of element dielectric isolation layers 12 (Shallow Trench Isolators: STIs). The plural element dielectric isolation layers 12 extend in the X direction in parallel with each other. Here, the bottom faces (faces on the −z side) of the plural element dielectric isolation layers 12 are flat. On the other hand, the top faces (faces on the +z side) of the element dielectric isolation layers 12 are partially removed and thin at the upper parts of parts (FIG. 13C) other than the parts (FIG. 13B) immediately under the word lines 20. That is, in the element dielectric isolation layers 12, parts having a thin film thickness and parts having a heavy film thickness appear alternately in accordance with the cycle of the allocation of the ward lines 20 (FIG. 13E). An element dielectric isolation layer 12 is exemplified by $SiO_2$ (silicon oxide). In the Y direction, the plural bit lines 13 are isolated by the plural element dielectric isolation layers 12.

The plural bit lines 13 are formed in contact with the substrate 11. The bottom faces (faces on the −z side) of the bit lines 13 are flat. On the other hand, the top faces (faces on the +z side) of the bit lines 13 are on a plane identical to the top face of the substrate 11 (surfaces of the element dielectric isolation layers 12) at parts where memory cells 10 do not exist (FIG. 13C). At parts where memory cells 10 exist however, the top faces are depressed (thinned, FIG. 13B) to the extent corresponding to diodes 15 (second semiconductor layers 14 thereof). That is, in the bit lines 13, parts having a thin film thickness and parts having a heavy film thickness appear alternately in accordance with the cycle of the allocation of the memory cells 10 (FIG. 13D). A bit line 13 is a wire of a first conduction type semiconductor differently from the substrate 11 and is exemplified by a wire of $n^+$-type Si (silicon). It is possible to reduce the resistance of a bit line 13 by using a high concentration doped semiconductor (for example, $n^+$-type silicon). The first conduction type concentration in the film thickness direction in a bit line 13 is not necessarily uniform and any concentration is acceptable as long as it is within a prescribed concentration range.

A first semiconductor layer 13 of a diode 15 is included in a bit line 13 and is a region in a bit line 13 where a memory cell 10 exists (FIG. 13D). A first semiconductor layer 13 is substantially identical to at least the upper part of a bit line 13 in the region. That is, a bit line 13 (at least the upper part thereof) also serves as a first semiconductor layer 13 in the region. A first semiconductor layer 13 is a first conduction type like a bit line 13 and is exemplified by $n^+$-type Si (silicon). The first conduction type concentration in the film thickness direction in a first semiconductor layer 13 is not necessarily uniform and any concentration is acceptable as long as it is within a prescribed concentration range.

A second semiconductor layer 14 of a diode 15 extends from the upper part of a bit line 13 (first semiconductor layer 13) to the middle of the interior thereof (FIG. 13D). A second semiconductor layer 14 may also be regarded as being embedded into a concavity (or a recess) in a bit line (first semiconductor layer 13). That is, a second semiconductor layer 14 is formed so as to fill a concavity (or a recess) in a first semiconductor layer 13 having a concave shape (or a recess) (FIG. 13D). Here, although the shape of a concavity (or a second semiconductor layer 14) in a first semiconductor layer 13 is roughly a rectangular shape in the example of FIG. 13D, the present embodiment is not limited to the example. That is, the shape of concavity (or a second semiconductor layer 14) may have such another shape as increase a contact area (junction area) with a first semiconductor layer 13 and also the number thereof may be plural. A second semiconductor layer 14 is formed so as to fill such a concavity (or recess). A second semiconductor layer 14 is a second conduction type that is different from a first conduction type and is exemplified by $p^+$-type Si (silicon). The first conduction type concentration and the second conduction type concentration in the film thickness direction in a second semiconductor layer 14 are not necessarily uniform and any concentrations are acceptable as long as they are within prescribed concentration ranges.

The first semiconductor layers 13 and the second semiconductor layers 14 are manufactured preferably by using the semiconductor of a substrate 11 as it is as it will be described later. The reason is that electric current to be fed to a diode 15 may possibly be restricted as stated above in the case of polycrystal silicon or silicon of selective epitaxial growth.

By configuring a diode 15 in this way, a second semiconductor layer 14 can touch a first second semiconductor layer 13 not only on the bottom face in the −Z direction but also on both the side faces in the X direction. Consequently, it is possible to increase a contact area between a first semiconductor layer 13 and a second semiconductor layer 14 in comparison with the case of simply stacking a first semiconductor layer and a second semiconductor layer and making them into contact with each other on the planes. The contact area corresponds to a junction area in a diode 15. Consequently, by the above, configuration, it is possible to increase the junction area in a diode 15 and also increase the quantity of electric current capable of flowing in a diode 15.

A lower electrode 16 in a resistance change part 19 is on a plane identical to the top face (surface of an element dielectric isolation layer 12) of the substrate 11 in a part where a memory cell 10 exists (FIG. 13B). A resistance change layer 17 and an upper electrode 18 are stacked in this order and extend in the Y direction (FIG. 13B). The thickness of a resistance change layer 17 is about 10 nm for example. The thicknesses of an upper electrode 18 and a lower electrode 16 are about 20 nm for example.

A word line 20 is stacked over a resistance change layer 17 and an upper electrode 18 and extends in the Y direction (FIG. 13B).

An interlayer insulation layer 21 is formed so as to cover the ward lines 20, the bit lines 13, and the memory cells 10. The upper part of the interlayer insulation layer 21 is flattened.

By the above configuration, in a nonvolatile semiconductor memory device 1A according to the present embodiment, it is possible to configure a memory cell 10 so as to have an 1D1R structure and comprise the minimum unit cell area $4F^2$. As a result, it is possible to obtain higher integration. Further, since an embedded bit line 13 uses a high concentration doped semiconductor, it is possible to reduce the resistance. As a result, it is possible to increase operation speed. Furthermore, it is possible to increase the contact area between a first semiconductor layer 13 and a second semiconductor layer 14. As a result, it is possible to increase the junction area of a diode 15 and also increase the quantity of electric current capable of flowing in a diode 15.

A manufacturing method of a nonvolatile semiconductor memory device according to the fourth embodiment of the present invention is explained hereunder. FIGS. 14A to 14I are perspective views schematically showing a manufacturing method of a nonvolatile semiconductor memory device according to the fourth embodiment of the present invention.

Figure 14A:
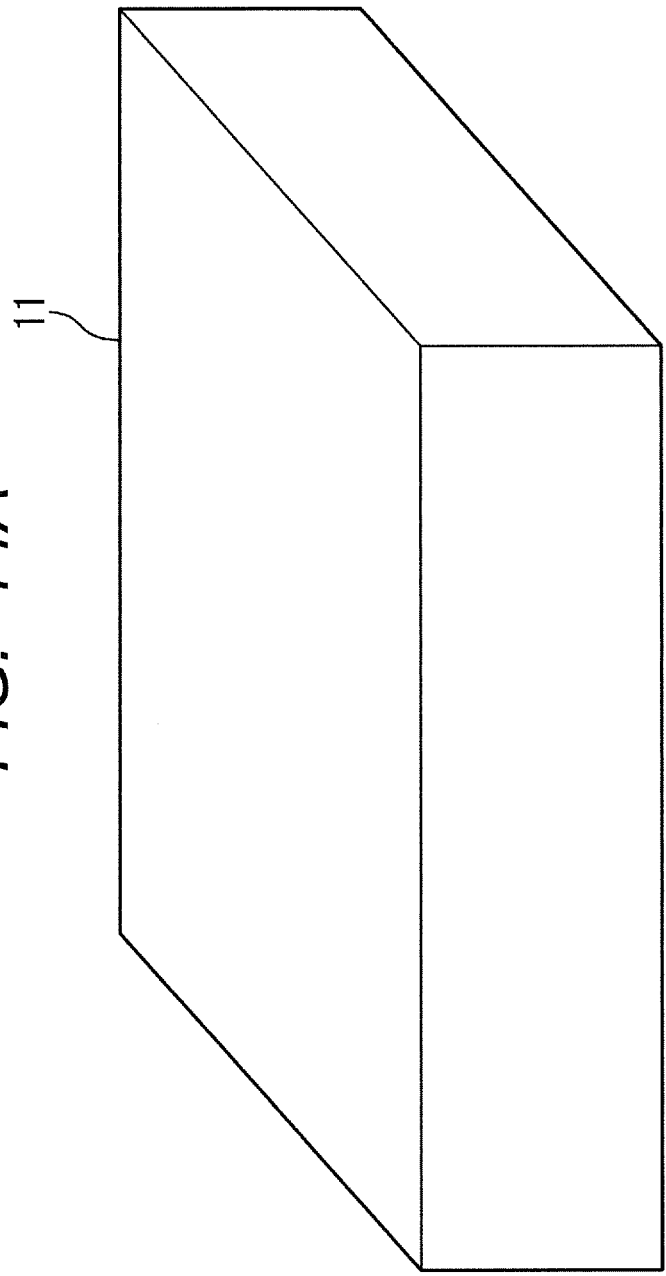
FIG. 14A is a perspective view schematically showing a manufacturing method of the nonvolatile semiconductor memory device according to the fourth embodiment of the present invention.

Firstly as shown in FIG. 14A, a p-type Si (silicon) substrate that is a second conduction type semiconductor substrate is prepared as a substrate 11.

Figure 14B:
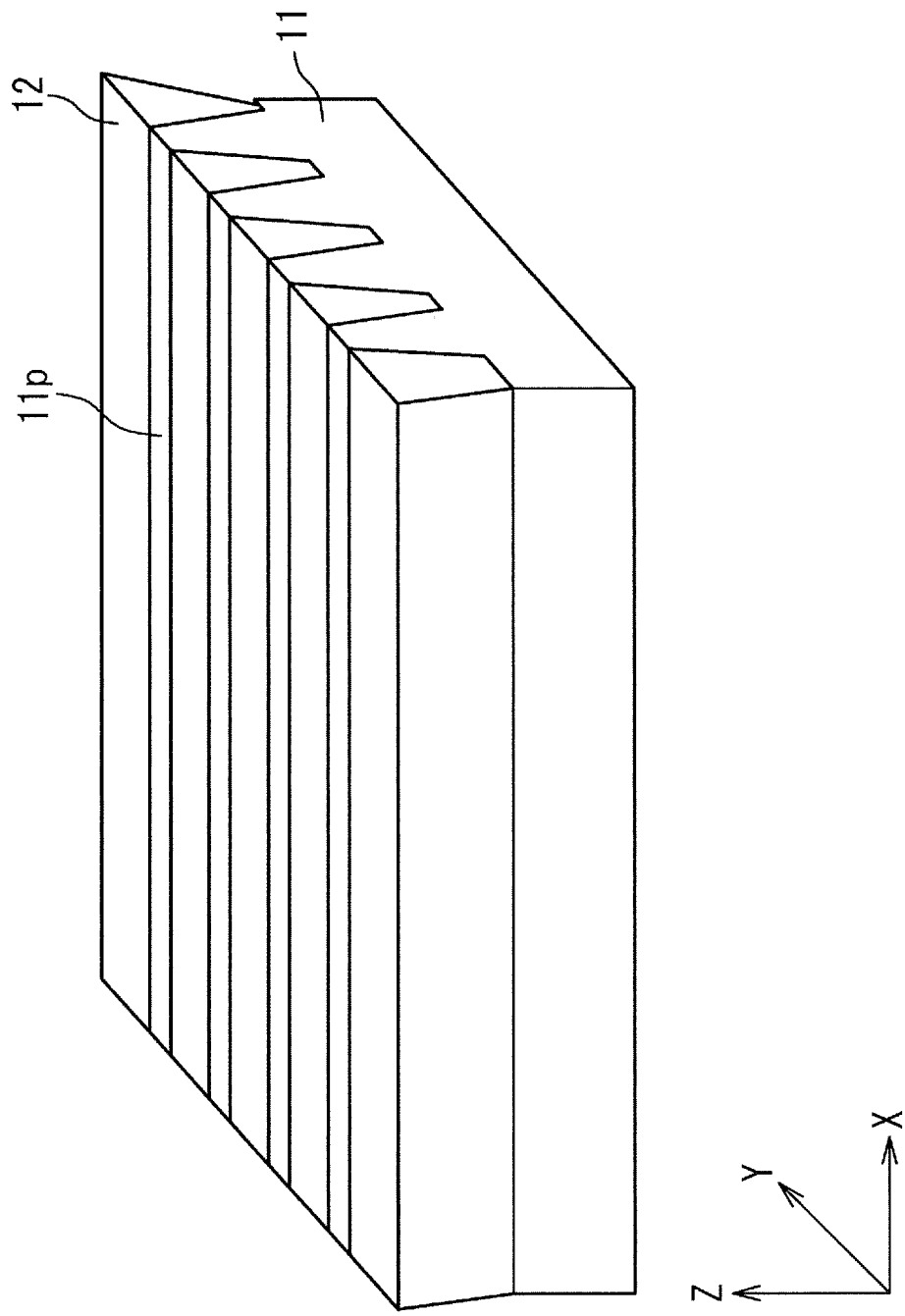
FIG. 14B is a perspective view schematically showing the manufacturing method of the nonvolatile semiconductor memory device according to the fourth embodiment of the present invention.

Successively as shown in FIG. 14B, a plurality of element dielectric isolation layers 12 (for example, SiO$_2$ (silicon oxide)) extending in the X direction in parallel with each other are formed in the substrate 11. In this way, a plurality of rectangular semiconductor regions 11p are formed between the plural element dielectric isolation layers 12. The semiconductor regions 11p are regions where p-type silicon is exposed between the element dielectric isolation layers 12. The plural rectangular semiconductor regions 11p extend in the X direction in parallel with each other.

Figure 14C:
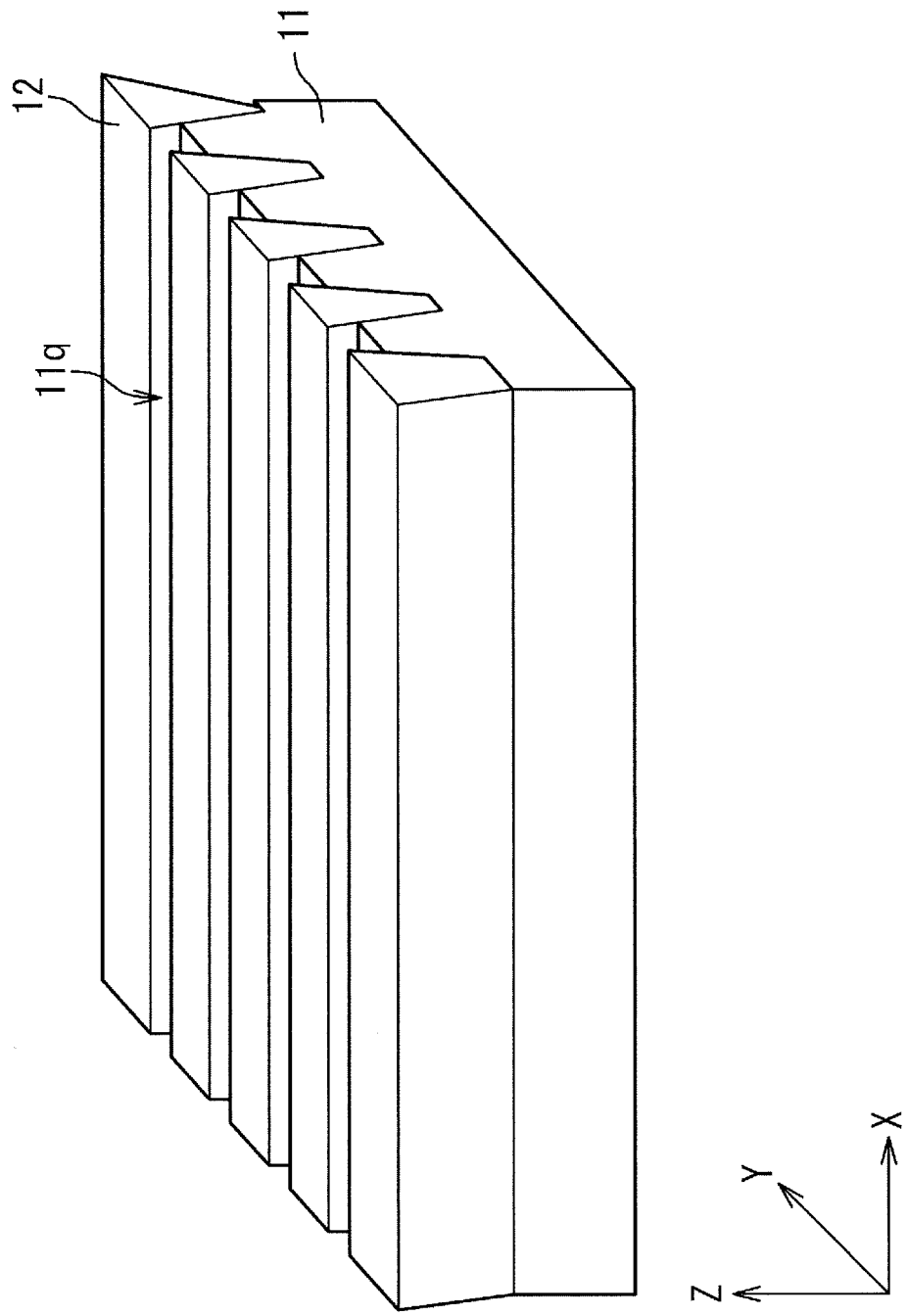
FIG. 14C is a perspective view schematically showing the manufacturing method of the nonvolatile semiconductor memory device according to the fourth embodiment of the present invention.

Successively as shown in FIG. 14C, the upper parts of the plural semiconductor regions 11p are etched back. In this way, a plurality of rectangular concave structures 11q are formed between the plural element dielectric isolation layers 12. The bottom face of each of the concave structures 11q is the top face of each of the semiconductor regions 11p and the side faces thereof are the side faces of each of the element dielectric isolation layers 12. The plural concave structures 11q extend in the X direction.

Figure 14D:
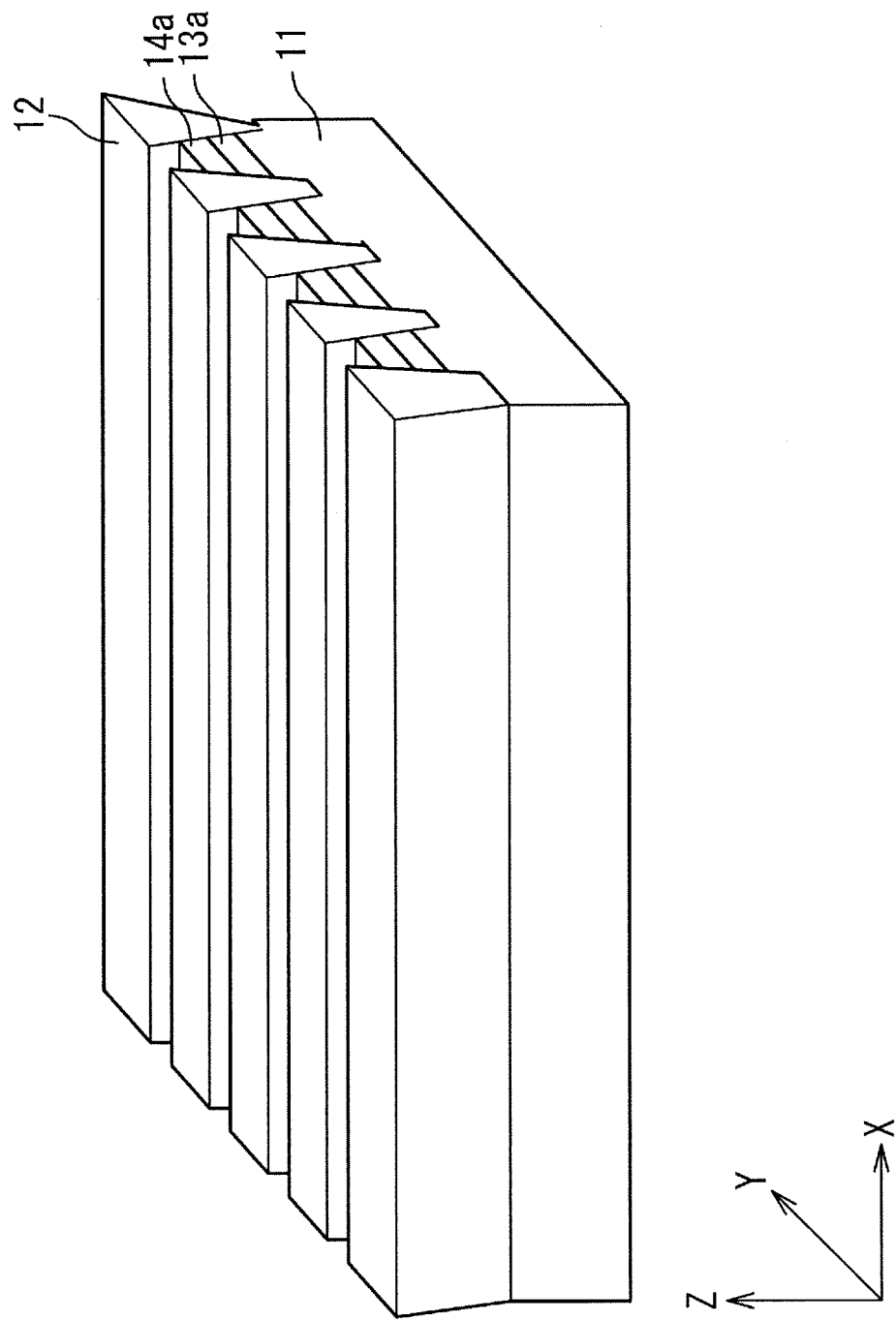
FIG. 14D is a perspective view schematically showing the manufacturing method of the nonvolatile semiconductor memory device according to the fourth embodiment of the present invention.

Successively as shown in FIG. 14D, ion implantation of first conduction type impurities is applied relatively deeply to the plural semiconductor regions 11p. In this way, a first ion-implanted-layer 13a of the first conduction type is formed at a deep part of each of the semiconductor regions 11p. For example, an n$^+$-type Si (silicon) layer as a first ion-implanted layer 13a is formed at a deep part by implanting ion species including P (phosphor) ions of n-type impurities relatively deeply. Successively, ion implantation of second conduction type impurities is applied to the plural semiconductor regions 11p relatively shallowly. In this way, a second ion-implanted layer 14a of the second conduction type is formed at a shallow part of each of the semiconductor regions 11p, For example, a p$^+$-type Si (silicon) layer as a second ion-implanted layer 14a is formed at a shallow part by implanting ion species including B (boron) ions of p-type impurities relatively shallowly. As a result, a p-n junction structure that comes to be a diode 15 at a later process is formed. A first ion-implanted layer 13a comes to be a bit line 13 at a later process.

Figure 14E:
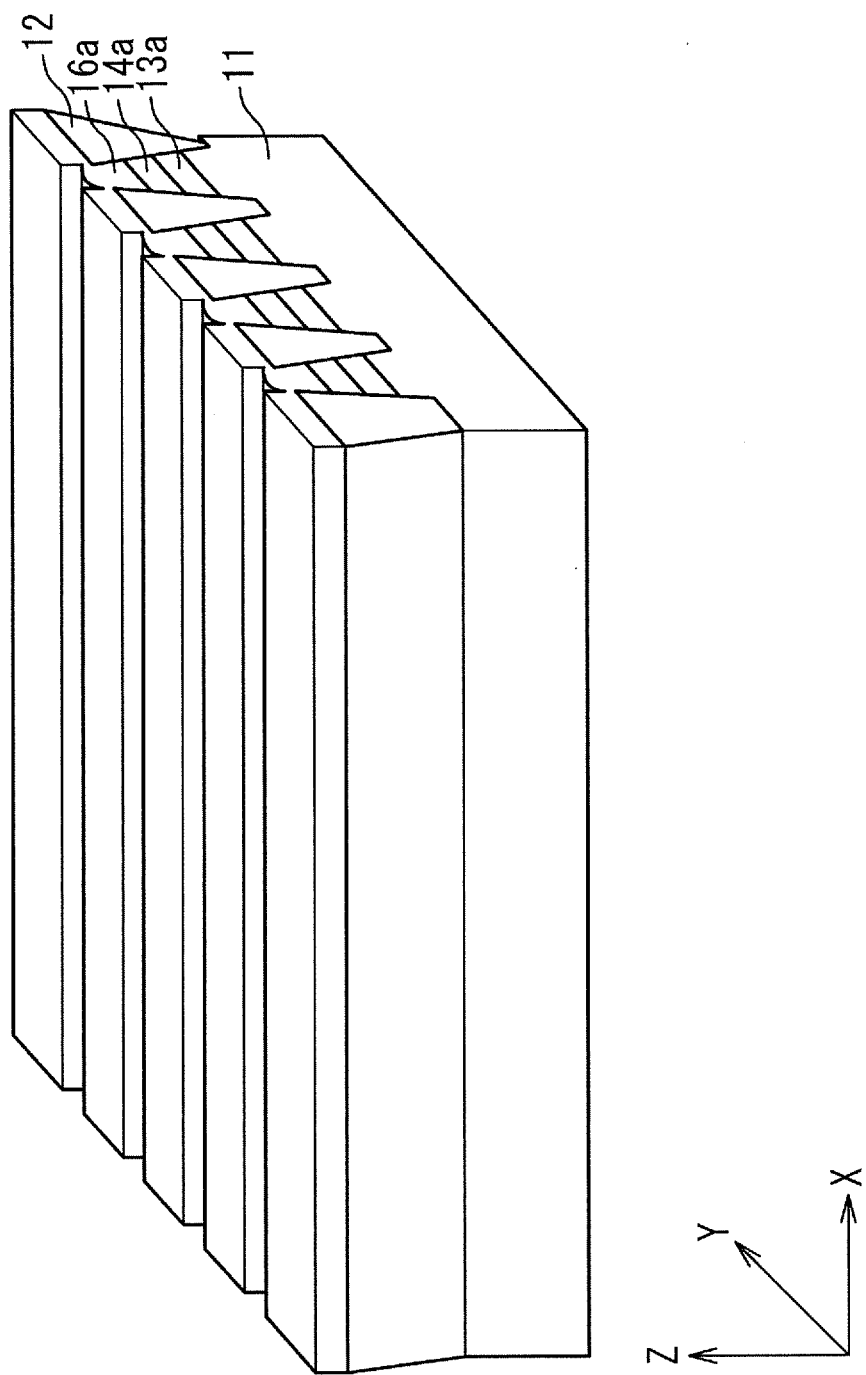
FIG. 14E is a perspective view schematically showing the manufacturing method of the nonvolatile semiconductor memory device according to the fourth embodiment of the present invention.

Successively as shown in FIG. 14E, a lower electrode film 16a is formed so as to cover the whole face of the substrate 11. For example, as the lower electrode film 16a, a W (tungsten) layer of 5 nm and a TiNx (titanium nitride) layer of 5 nm are stacked in this order. In this way, the plural element dielectric isolation layers 12 and the plural concave structures 11q (second ion-implanted layers 14a in the semiconductor regions 11p) are covered with the lower electrode film 16a.

Figure 14F:
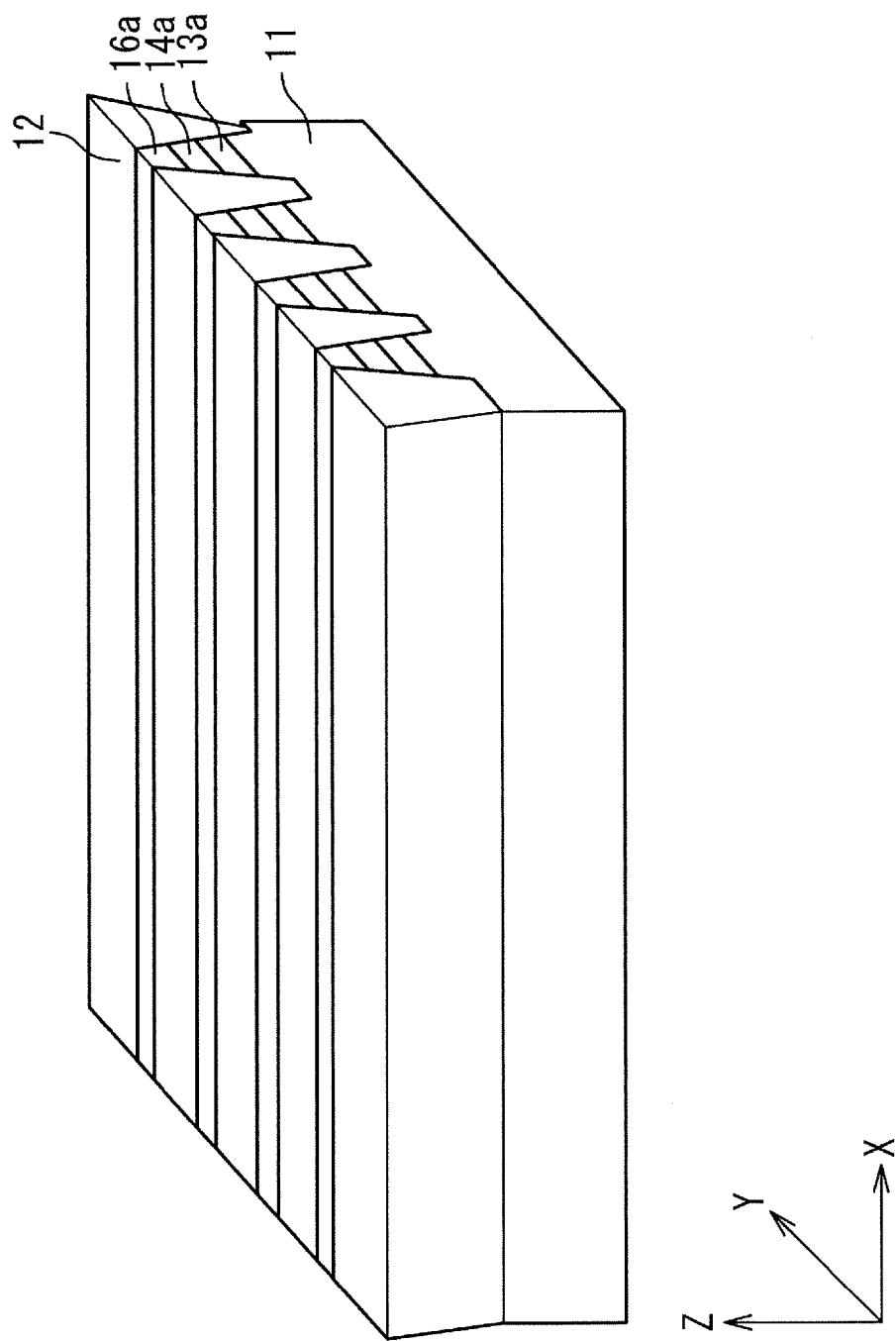
FIG. 14F is a perspective view schematically showing the manufacturing method of the nonvolatile semiconductor memory device according to the fourth embodiment of the present invention.

Successively as shown in FIG. 14F, flattening treatment is applied by CMP (Chemical Mechanical Polishing) while the plural element dielectric isolation layers 12 are used as a stopper. In this way, plural embedded structures of the plural lower electrode films 16a are formed so as to fill the upper parts (concave structures 11q) of the plural semiconductor regions 11p.

Figure 14G:
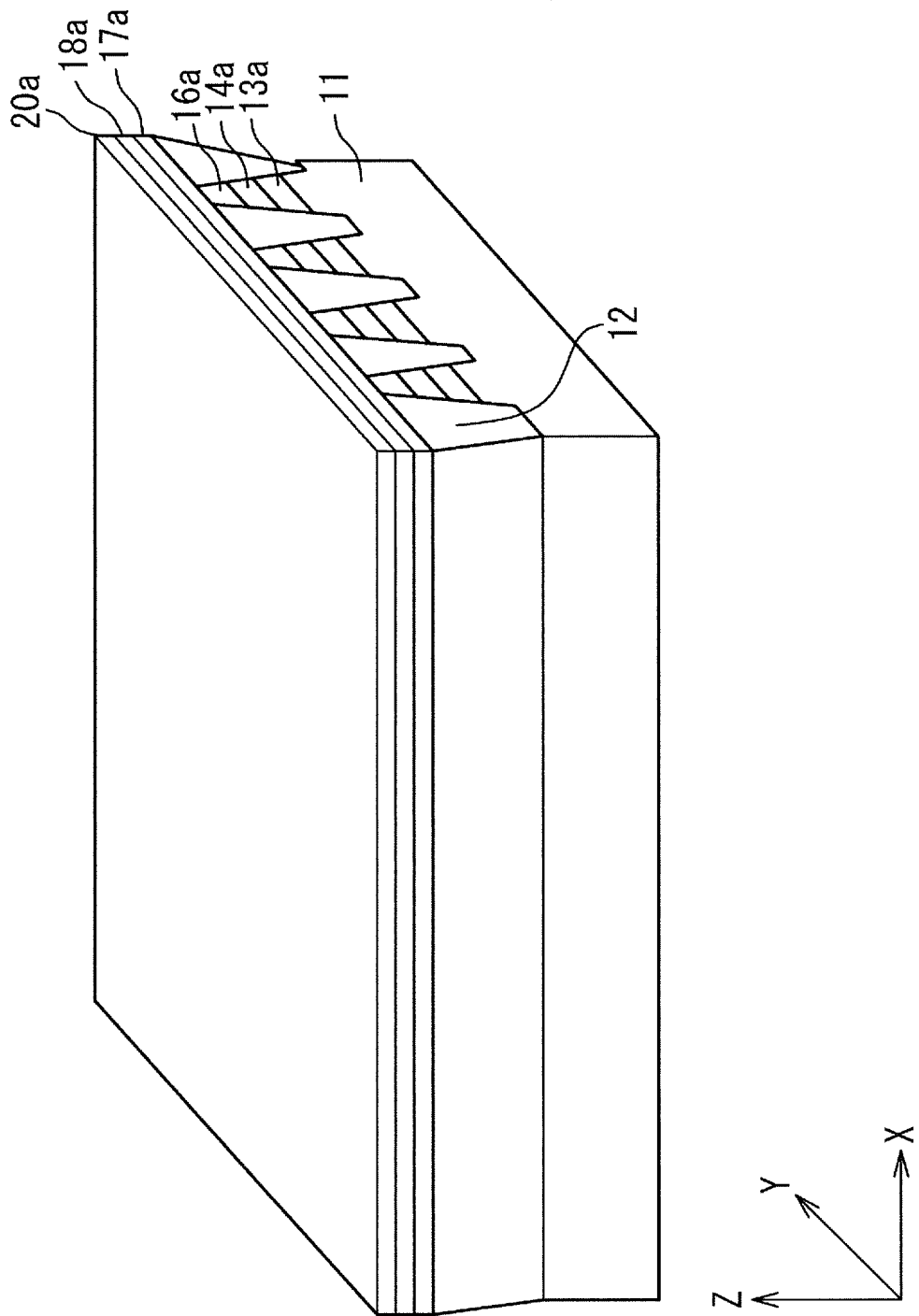
FIG. 14G is a perspective view schematically showing the manufacturing method of the nonvolatile semiconductor memory device according to the fourth embodiment of the present invention.

Successively as shown in FIG. 14G, a resistance change layer film 17a, an upper electrode film 18a, and a word line film 20a are formed in this order so as to cover the plural element dielectric isolation layers 12 and the plural embedded lower electrode films 16a. For example, a ZrOx (zirconium oxide) layer of 10 nm is formed as the resistance change layer film 17a, a TiNX (titanium nitride) layer and a W (tungsten) layer of 5 nm respectively in this order as the upper electrode film 18a, and a TaNx (tantalum nitride) layer and a Cu (copper) layer in this order as the word line film 20a.

Figure 14H:
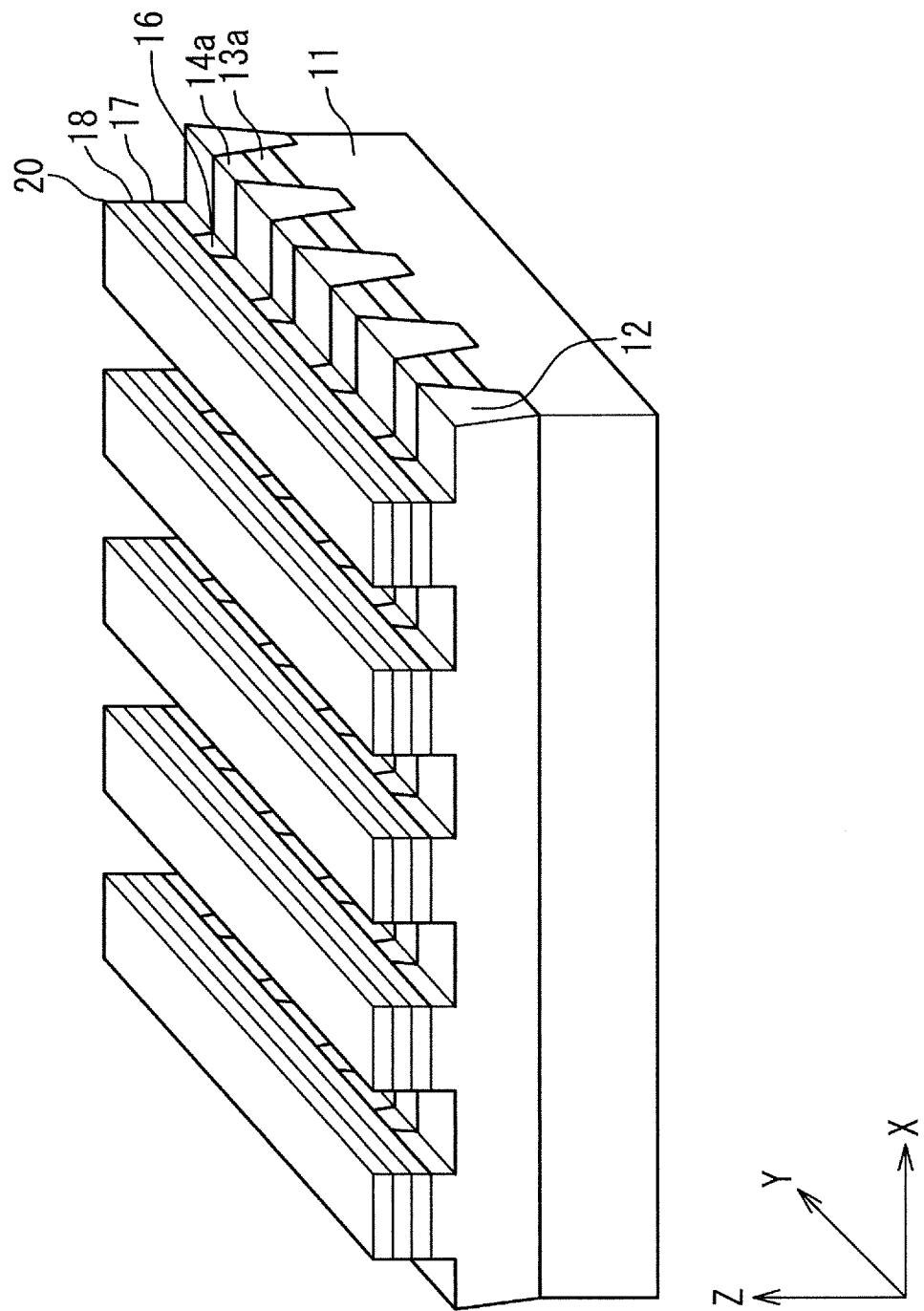
FIG. 14H is a perspective view schematically showing the manufacturing method of the nonvolatile semiconductor memory device according to the fourth embodiment of the present invention.

Successively as shown in FIG. 14H, word lines 20 and, below that, upper electrodes 18, resistance change layers 17, and lower electrodes 16 are formed by etching the word line film 20a, the upper electrode film 18a, the resistance change layer film 17a, the plural lower electrode films 16a, and the plural element dielectric isolation layers 12 so as to extend the plural word lines 20 in the Y direction while the plural second ion-implanted layers 14a are used as an etching stopper. In this way, an embedded lower electrode 16, a resistance change layer 17, and an upper electrode film 18 under a word line 20 come to be a resistance change part 19.

Figure 14I:
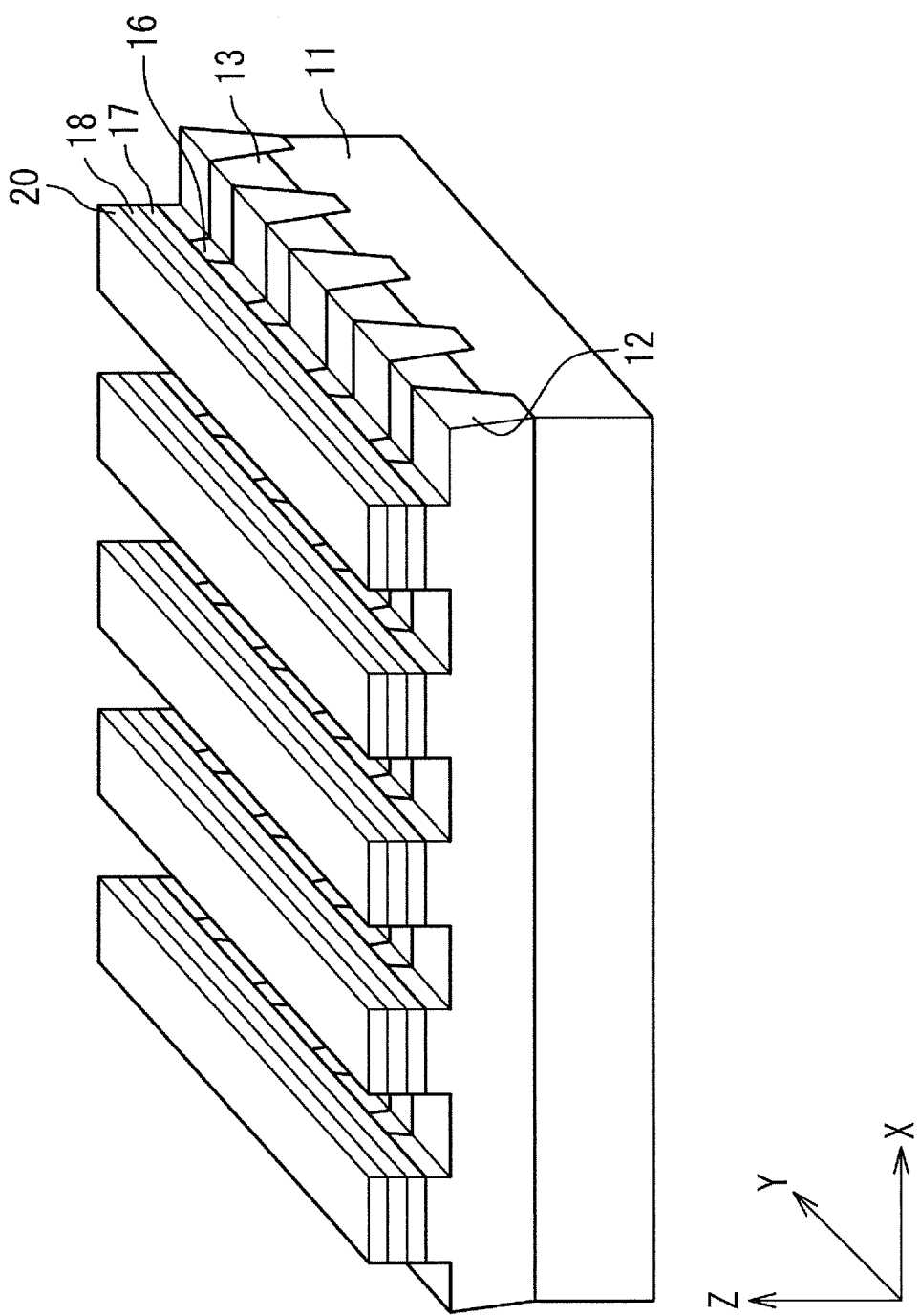
FIG. 14I is a perspective view schematically showing the manufacturing method of the nonvolatile semiconductor memory device according to the fourth embodiment of the present invention.

Successively as shown in FIG. 14I, ion-implantation of first conduction type impurities is applied to the exposed part of each of the second ion-implanted layers 14a. In this way, the exposed part of each of the second ion-implanted layers 14a comes to be a first conduction type and the not-exposed part (the part covered with a lower electrode 16) of each of the second ion-implanted layers 14a remains as the second conduction type. For example, the exposed part of each of the second ion-implanted layers 14a is converted into an n$^+$-type Si (silicon) layer by implanting ion species including P (phosphor) ions of n-type impurities into the exposed part of each of the second ion-implanted layers 14a and the not-exposed part of each of the second ion-implanted layers 14a remains as a p$^+$-type Si (silicon) layer. As a result, the ion-implanted part of each of the second ion-implanted layers 14a and a first ion-implanted layer 13a come to be a first conduction type first semiconductor layer 13 of a diode 15. Each of the first semiconductor layers 13 serves also as a bit line 13. On the other hand, the non-exposed part of each of the second ion-implanted layers 14a comes to be a second conduction type second semiconductor layer 14 of a diode 15.

Successively, an interlayer insulation film (not shown in the figures), such as silicon oxide, is formed so as to cover the whole face of the substrate 11. Then flattening treatment is applied by CMP. In this way, it is possible to manufacture a nonvolatile semiconductor memory device 1 as shown in FIGS. 13A to 13E.

As stated above, in the present embodiment, a part of a second ion-implanted layer 14a on both the sides except the second ion-implanted layer 14a (second conduction type) immediately under a lower electrode 16 is converted into a first conduction type first ion-implanted layer 13a by ion implantation (FIG. 14I). As a result, a second semiconductor layer 14 of a diode 15 is embedded into the concavity (or recess) of a first semiconductor layer 13 (bit line 13). By manufacturing a diode 15 in this way, it is possible to increase the contact area between a first semiconductor layer 13 and a second semiconductor layer 14 in comparison with the case of simply stacking the first semiconductor layer 13 and the second semiconductor layer 14 and bringing them into planar contact with each other. That is, it is possible to increase the junction area of a diode 15 and also increase electric current capable of flowing in the diode 15. Further, by converting a second ion-implanted layer 14a except a part immediately under a lower electrode 16 into the first conduction type doped at a high concentration, it is possible to reduce the resistance of an embedded bit line 13.

By the above manufacturing method, alignment in a structure of interposing a resistance change part with lattice-shaped wires is required only once at the process of FIG. 14H. Consequently, margin in consideration of alignment accuracy comes to be unnecessary. That is, it is possible to form a memory cell 10 in a self-aligned manner between a bit line 13 and a word line 20. As a result, it is possible to materialize a memory cell size of the minimum unit cell 4F$^2$.

Effects similar to the first and second embodiments are obtained in the present embodiment. In the present embodiment additionally, it is possible to relatively expand a p-n junction area of a diode 15 in spite of the miniaturization of a memory cell 10. As a result, it is possible to feed a sufficient quantity of electric current to a memory cell 10 and carry out resistance change operation even when the memory cell 10 is miniaturized. Further, it is possible to form a cross point type structure of a memory cell 10 in a self-aligned manner and a memory cell of the minimum unit cell can be materialized. Moreover, it is possible to reduce the resistance of a bit line 13 by using a high concentration doped semiconductor.

Each of the nonvolatile semiconductor memory devices and resistance change elements explained above can be applied not only to the case of using it as a nonvolatile memory (for example, a large-capacity nonvolatile memory such as an ReRAM) but also to a semiconductor device such as an anti-fuse, a mask ROM (Read Only Memory), an FPGA (Field-Programmable Gate Array), a memory consolidated system LSI (Large Scale Integration), or a logic consolidated memory.

It is obvious that the present invention is not limited to the above embodiments and the embodiments are transformed or modified arbitrarily within the range of the technological thought of the present invention. Further, the technologies used in the embodiments are not limited to the applications in the embodiments and can be applied to other embodiments within the range not yielding technological inconsistency.

What is claimed is:

1. A nonvolatile semiconductor memory device comprising:
    a first wire;
    a second wire; and
    a memory cell electrically coupled to said first wire at an end and said second wire at the other end,
    wherein said memory cell includes:
    a resistance change layer to memorize information by changing a resistance value; and
    a first electrode and a second electrode being coupled to both the ends of said resistance change layer and not containing a precious metal,
    wherein said first electrode includes:
    a first outside electrode; and
    a first interface electrode formed between said first outside electrode and said resistance change layer,
    wherein the thickness of said first interface electrode is thinner than the thickness of said first outside electrode,
    wherein the resistivity of said first interface electrode is higher than the resistivity of said first outside electrode, and
    wherein the resistance value of said first electrode is lower than the resistance value of said resistance change layer in a low resistance state.

2. A nonvolatile semiconductor memory device according to claim 1, wherein the material of said first interface electrode is hardly oxidized in comparison with an element included in said resistance change layer.

3. A nonvolatile semiconductor memory device according to claim 1, wherein said first interface electrode comprises a transition metal nitride.

4. A nonvolatile semiconductor memory device according to claim 3, wherein said first interface electrode comprises a titanium nitride or a tantalum nitride.

5. A nonvolatile semiconductor memory device according to claim 1, wherein said first interface electrode comprises 2 to 20 atomic layers.

6. A nonvolatile semiconductor memory device according to claim 1, wherein the thickness of said first electrode is larger than 0% to not larger than 80% of the diameter of filament formed in said resistance change layer.

7. A nonvolatile semiconductor memory device according to claim 1,
    wherein said second electrode includes:
    a second outside electrode; and
    a second interface electrode formed between said second outside electrode and said resistance change layer,
    wherein the thickness of said second interface electrode is thinner than the thickness of said second outside electrode,
    wherein the resistivity of said second interface electrode is higher than the resistivity of said second outside electrode, and
    wherein the resistance value of said second electrode is lower than the resistance value of said resistance change layer in a low resistance state.

8. A nonvolatile semiconductor memory device according to claim 1,
    wherein said first outside electrode comprises a metal film, and
    wherein said first interface electrode comprises a metal nitride.

9. A nonvolatile semiconductor memory device according to claim 8, wherein the nitrogen concentrations in said first interface electrode and said first outside electrode decrease continuously from said first interface electrode toward said first outside electrode.

10. A nonvolatile semiconductor memory device according to claim 1, wherein said memory cell further has a transistor coupled in series to either said first electrode or said second electrode.

11. A nonvolatile semiconductor memory device according to claim 1, wherein said memory cell further has a diode coupled in series to either said first electrode or said second electrode.

* * * * *